US007823793B2

(12) United States Patent
Higuchi et al.

(10) Patent No.: US 7,823,793 B2
(45) Date of Patent: Nov. 2, 2010

(54) IC CARD AND AN ADAPTER FOR THE SAME

(75) Inventors: Akira Higuchi, Kodaira (JP); Hirotaka Nishizawa, Fuchu (JP); Junichiro Osako, Kodaira (JP); Kenji Osawa, Hachioji (JP)

(73) Assignees: Renesas Electronics Corporation, Kawasaki-shi (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 12/261,993

(22) Filed: Oct. 30, 2008

(65) Prior Publication Data
US 2009/0065593 A1    Mar. 12, 2009

Related U.S. Application Data

(63) Continuation of application No. 11/681,046, filed on Mar. 1, 2007, now abandoned, which is a continuation of application No. 10/676,098, filed on Oct. 2, 2003, now abandoned.

(30) Foreign Application Priority Data
Oct. 9, 2002   (JP)   ............... 2002-296472

(51) Int. Cl.
*G06K 19/06* (2006.01)
(52) U.S. Cl. ..................................... 235/492
(58) Field of Classification Search ................ 235/441, 235/492; 361/737, 822; 439/60; 902/26
See application file for complete search history.

(56) References Cited

U.S. PATENT DOCUMENTS

| 5,887,145 | A | 3/1999 | Harari et al. |
| 6,088,755 | A | 7/2000 | Kobayashi et al. |
| 6,193,162 | B1 | 2/2001 | Niwata et al. |
| 6,408,352 | B1 | 6/2002 | Hosaka et al. |
| 6,433,285 | B2 | 8/2002 | Maeda et al. |
| 6,574,112 | B2 | 6/2003 | Washino et al. |
| 6,612,492 | B1* | 9/2003 | Yen ............................ 235/451 |
| 6,663,007 | B1 | 12/2003 | Sun et al. |
| 6,663,398 | B2 | 12/2003 | Shimada et al. |
| 6,761,313 | B2 | 7/2004 | Hsieh et al. |

(Continued)

FOREIGN PATENT DOCUMENTS

CN    1201235 A    12/1998

(Continued)

*Primary Examiner*—Seung H Lee
(74) *Attorney, Agent, or Firm*—Miles & Stockbridge P.C.

(57) ABSTRACT

An IC card and card adapters are designed so that the IC card of a specific standard (e.g., MMC standard) is compatible with IC cards and terminals of other standards (e.g., MS card standard and USB terminal standard). In the IC card (MMC), a controller IC, which is connected to a flash memory, includes a voltage pull-down detector, a mode controller, a USB-mode interface controller, a MS-mode interface controller, and an MMC/SD-mode interface controller. The card adapters suffice to have component parts which are easy in formation and low in cost such as wiring lines and resistors. The voltage pull-down detector of the IC card detects the voltage pull-down caused by the resistors, and the mode controller selects the USB-mode interface controller, MS-mode interface controller or MMC/SD-mode interface controller so that the IC card becomes compatible with the corresponding IC card standard.

12 Claims, 37 Drawing Sheets

U.S. PATENT DOCUMENTS

| | | |
|---|---|---|
| 6,768,645 B2 | 7/2004 | Kadonaga |
| 6,865,096 B1 | 3/2005 | Geissler |
| 6,945,465 B2 | 9/2005 | Nishizawa et al. |
| 7,234,644 B2 * | 6/2007 | Nishizawa et al. .......... 235/492 |
| 2006/0253636 A1 | 11/2006 | Jones et al. |

FOREIGN PATENT DOCUMENTS

| | | |
|---|---|---|
| CN | 1308391 A | 8/2001 |
| JP | 07-141114 | 6/1995 |
| JP | 2000-214970 A | 8/2000 |
| JP | 2001-209773 A | 8/2001 |
| JP | 2001-307025 A | 11/2001 |
| JP | 2001-307801 | 11/2001 |
| JP | 3-090671 U | 10/2002 |

* cited by examiner (SURFACE)

(BACK)

FIG. 46

| | MEMORY STICK | MEMORY STICK Duo | SMART MEDIA | COMPACT FLASH | MULTIMEDIA CARD | SD MEMORY CARD |
|---|---|---|---|---|---|---|
| SIZE (mm) | 21.5×50×2.8 | 20×31×1.6 | 37×45×0.76 | 42.8×36.4×3.3 | 24×32×1.4 | 24×32×2.1 |
| WEIGHT (g) | 4 | 2 | 2 | 8~15 | 1.5 | 2 |
| VOLUME (mm³) | 3,010 | 992 | 1,265 | 5,141 | 1,075 | 1,612 |
| DEVELOPING COMPANY | S1 | S1 | T | S2 | S3 S2 | M T S2 |
| TERMINALS | 10 | 10 | 22 | 50 | 7 | 9 |
| STORAGE CAPACITY (MB) | 8,16,32,64,128 | 8,16,32,64 | 4~64 | 4~192 | 4~64 | 8~64 |
| DATA TRANSFER RATE | 1.8MB/s Max.(W) 2.45MB/s Max.(R) | 1.8MB/s Max.(W) 2.45MB/s Max.(R) | — | — | — | — |
| COPYRIGHT | SDMI-CONFORMITY (Magic Gate) | SDMI-CONFORMITY (Magic Gate) | ID | ID | ID | SDMI-CONFORMITY |

IC CARD AND AN ADAPTER FOR THE SAME

CROSS-REFERENCE TO RELATED APPLICATION

This application is a continuation of application Ser. No. 11/681,046 filed Mar. 1, 2007, now abandoned which is a continuation of application Ser. No. 10/676,098 filed Oct. 2, 2003 now abandoned.

BACKGROUND OF THE INVENTION

The present invention relates to an IC card and a card adapter, and particularly to a technique of making a specific IC card usable as IC cards having different shapes, different number of terminals (external terminals), and different properties.

A memory card as small as a postage stamp, with an electrically writable/erasable nonvolatile memory called flash EEPROM (Electrically Erasable Programmable Read Only Memory) being built in, is in course of development.

Small memory cards have already been commercialized as storage mediums of small electronic appliances such as digital cameras and portable telephone units.

These memory cards are complicated in their standards (external dimensions, number of pins, function, etc.), and some memory card standards are incompatible with each other. FIG. 46 is a table of some standards of small memory cards, listing the development companies, product names and external dimensions of memory cards.

Japanese Unexamined Patent Publication No. Hei7 (1995)-141114 discloses a technique, in which a memory card 3a is set in a card adapter 30 and the adapter 30 is put into the memory card slot 21 of an information handling appliance 22 so that serial data transmission is established between the memory card 3a and the appliance 22: (refer to the abstract and FIG. 10 of the patent publication).

Japanese Unexamined Patent Publication No. 2001-307801 discloses a connector of memory card which has an inseparable upper and lower sections formed of resin constituting an SD card connector 10 to be coupled with an SD card 50 and a SIM card connector 20 to be coupled with a SIM card 60: (refer to the abstract and FIG. 2 of the patent publication).

SUMMARY OF THE INVENTION

Gaining the compatibility among various types of small memory cards based on the use of adapters is a crucial theme of study.

Reducing the size of IC chips built in a memory card meets the demand of smaller memory card, and at the same time yields more chips from a sheet of semiconductor wafer so that the manufacturing cost declines.

On this account, even among memory cards of the same standard, the profile and performance are ever changing for the improvement.

However, newly-designed memory cards, which are used effectively for the newest models of appliances oriented to these cards, cannot be used directly for older models. In addition, the usage of memory cards is expanding to match with the functional enhancement of small information handling appliances.

Accordingly, providing existing memory cards with the mutual compatibility so as to fit with various appliances is significant to meet the needs of card users and increase the demand of new memory cards.

It is an object of the present invention to provide an IC card which becomes compatible with IC cards of other standard by being set in a card adapter.

Another object of the present invention is to provide a card adapter which enables an IC card to become usable as an IC card of other standard.

These and other objects and novel features of the present invention will become apparent from the following description and attached drawings.

Among the affairs of the present invention disclosed in this specification, representatives are briefed as follows.

The inventive IC card is an IC card of a first standard, and it includes: (a) a plurality of external terminals, (b) a detector which detects the voltage level of a certain external terminal among the external terminals, (c) a mode controller which is connected to the detector, and (d) a first-mode interface controller corresponding to the first standard and a second-mode interface controller corresponding to a second standard, with both interface controllers being connected to the mode controller, (e) the mode controller including means of selecting the first-mode interface controller or second-mode interface controller in accordance with the output signal of the detector.

The inventive card adapter has an interior space which matches with the profile of an IC card of a first standard and has a profile of an IC card of a second standard, and it includes: (a) a plurality of first external terminals, (b) a plurality of internal terminals which are disposed at positions to be in contact with a plurality of second external terminals of an IC card of the first standard when the IC card is set in the adapter interior space, (c) wiring lines which connect between the first external terminals and the internal terminals, and (d) a resistor which is connected between a first external terminal, with a supply voltage or ground voltage being applied thereto, among the first external terminals and an internal terminal.

BRIEF DESCRIPTION OF THE DRAWINGS

FIG. 46 is a table of examples of standard of small memory cards, listing the development companies, product names and external dimensions of memory cards.

DESCRIPTION OF THE PREFERRED EMBODIMENTS

Embodiments of this invention will be explained in detail with reference to the drawings. Throughout the figures, items having the same functions are referred to by the common symbols, and explanation thereof is not repeated.

First Embodiment

The structure of an IC card (memory card) and card adapter based on a first embodiment of this invention will be explained.

Figure 1:
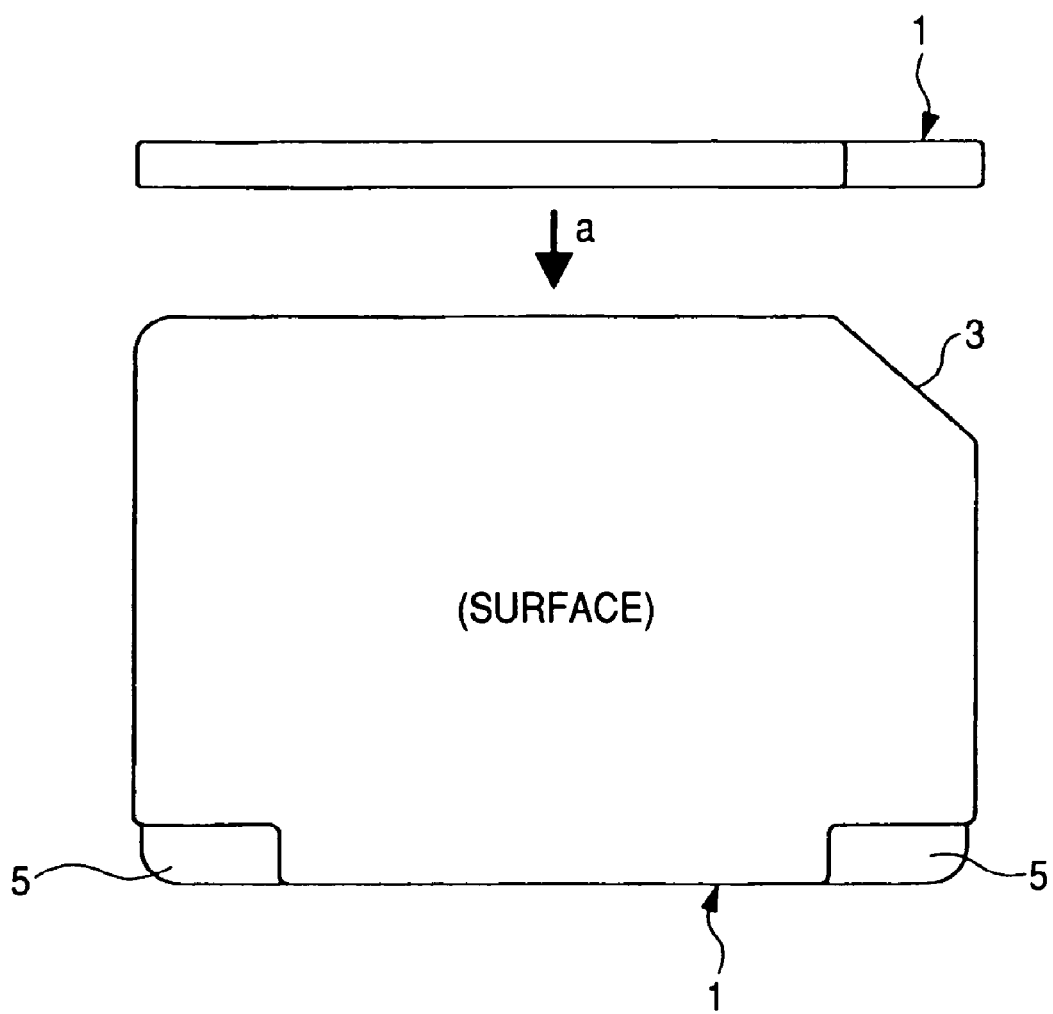
FIG. 1 is a top view and a first side view of an IC card based on a first embodiment of this invention.
Figure 2:
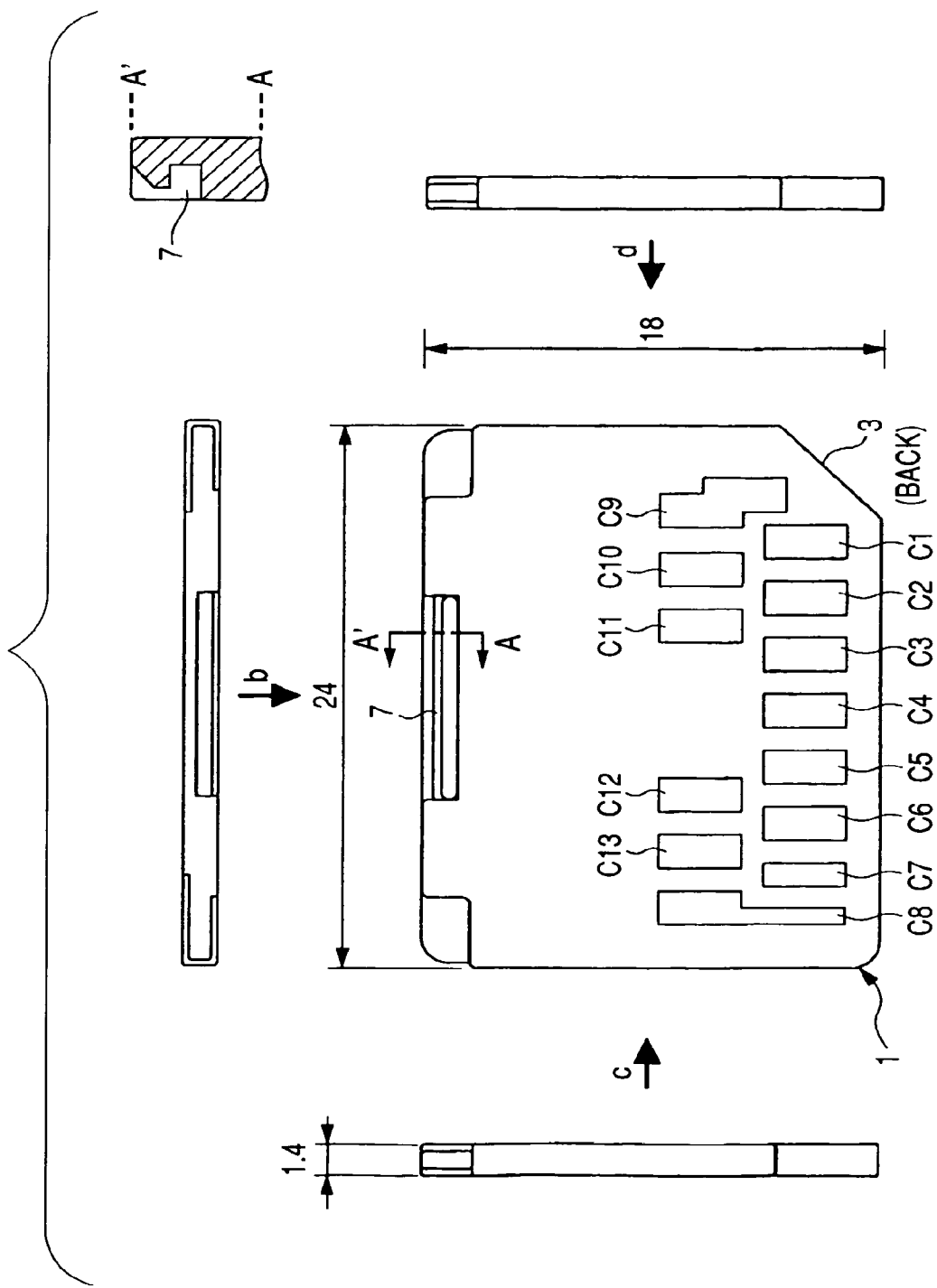
FIG. 2 is a set of diagrams of the IC card of the first embodiment, showing a rear view, a second and third side views, and a cross-sectional view taken along the line A-A' of the rear view.
Figure 3:
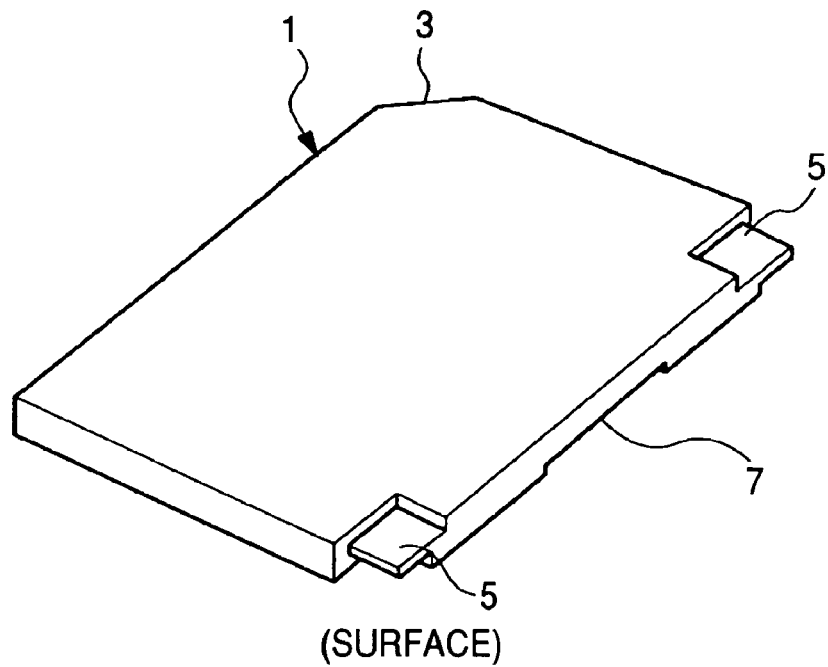
FIG. 3 is a perspective top view of the IC card of the first embodiment.
Figure 4:
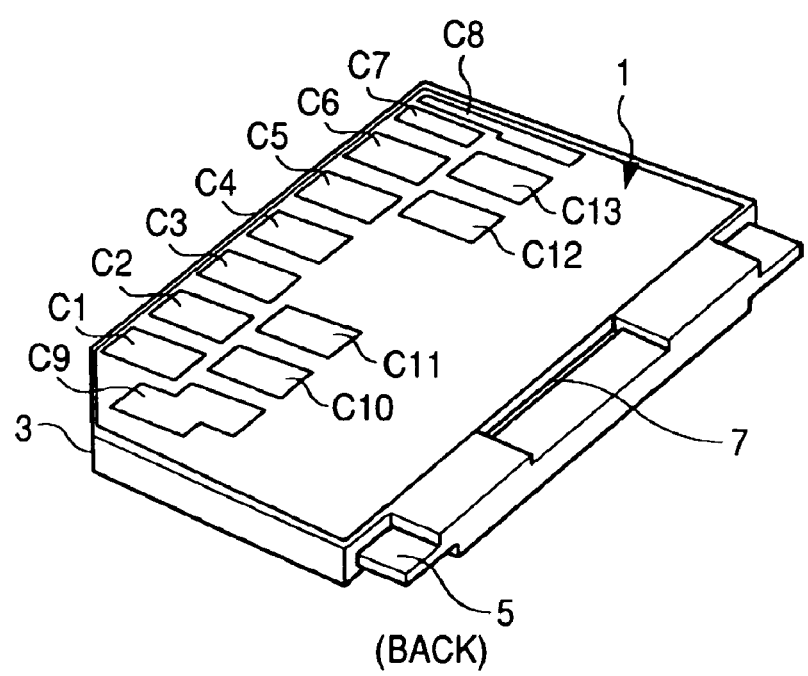
FIG. 4 is a perspective rear view of the IC card of the first embodiment.
Figure 5:
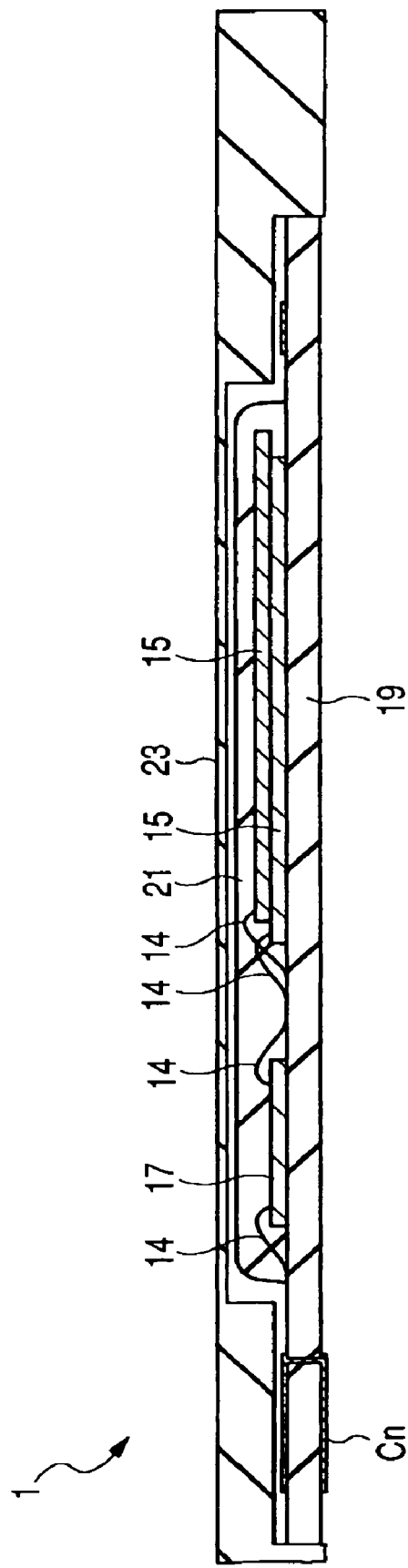
FIG. 5 is a cross-sectional diagram showing the principal portion of the IC card of the first embodiment.
Figure 6:
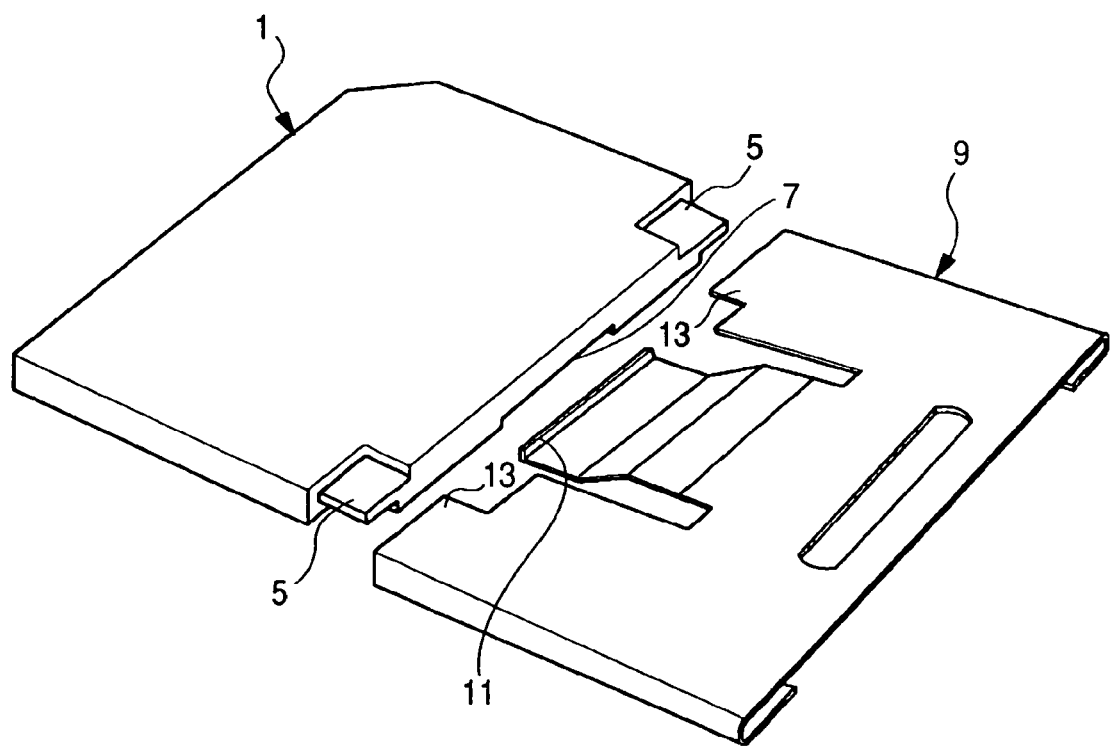
FIG. 6 is a perspective top view showing the spatial relation of the IC card and a card extender based on the first embodiment of this invention.

FIG. 1 through FIG. 5 show the card structure, of which FIG. 1 shows a top view and a first side view of the IC card seen in the direction indicated by "a" in the top view, FIG. 2 shows a rear view, a second and third side views seen in the direction indicated by "b", "c" and "d" and a cross-sectional view taken along the line A-A' of the rear view, FIG. 3 shows a perspective top view of the IC card 1, FIG. 4 shows a perspective rear view of the IC card, and FIG. 5 shows the cross section of the principal portion of the IC card. FIG. 6 shows the spatial relation of the IC card 1 and a card extender. The IC card and card adapter have external terminals on their rear side.

The IC card 1 has a generally rectangular profile of about 18 mm by 24 mm and has a thickness of about 1.4 mm. One of four corners is cut away for indexing as indicated by 3, serving to prevent the IC card 1 from being put in the opposite direction into an electronic appliance such as a personal computer. The remaining three corners are rounded with a relatively small curvature so that the cut 3 of one corner is distinctive.

Along the long side that includes the cut 3, there are arranged external terminals Cn (n=1 through 13). These external terminals are conductive strips exposed to the rear side of the IC card 1, and are connected to IC chips built in the IC card 1 (refer to FIG. 5). The external terminals Cn having a generally rectangular profile extend in parallel to the short sides of the IC card 1. Among these terminals, C1-C7 are aligned along the long side edge, and C8-C13 are aligned in the inner area next to C1-C7. Terminal C8 is located in the outer area next to C7, and terminal C9 is located in the outer area next to C1. Terminal C10 is located between C1 and C2, terminal C11 is located between C2 and C3, terminal C12 is located between C5 and C6, and terminal C13 is located between C6 and C7. Arranging the external terminals Cn in this layout pattern facilitates the formation of the internal terminals of the card adapter as will be explained later.

The number of external terminals of the IC card 1, which is not confined to 13 though, must be at least the maximum number of terminals among the IC card standards, as will be explained later, which the IC card 1 is intended to be compatible with.

Extender holders 5 are formed at both ends of the long side that does not include the cut 3, and an extender coupling groove 7 is formed at the middle of this long side. A card extender 9 is coupled to the IC card 1 by placed the extender corners 13 on the extender holders 5 of the IC card 1 and bringing the ridge 11 of the extender 9 into the groove 7 of the IC card 1 as shown in FIG. 6.

Based on the use of the card extender 9, the IC card 1 is compatible not only with the half-size card slot, but also with the full-size card slot (about the double of half-size) of electronic appliances.

The IC card 1 incorporates IC chips, e.g., a memory chip and a controller chip.

In an example shown in FIG. 5, the IC card 1 incorporates three IC chips, e.g., flash memory chips 15 which overlap and a controller chip 17.

These IC chips 15 and 17 are glued on a base board 19, and the chips are connected to each other and connected to the circuit pattern (not shown) on the base board through gold wiring lines 14 or the like. The circuit pattern of base board is connected to the external terminals Cn.

The IC chips 15 and 17 are coated with sealing resin 21 and further covered with a cap 23.

The build-in scheme of IC chips is not confined to the one shown in FIG. 5. Otherwise, for example, IC chips may be glued on a lead frame and coated with sealing resin, or IC chips may be glued on a base board and simply covered with a cap.

Figure 7:
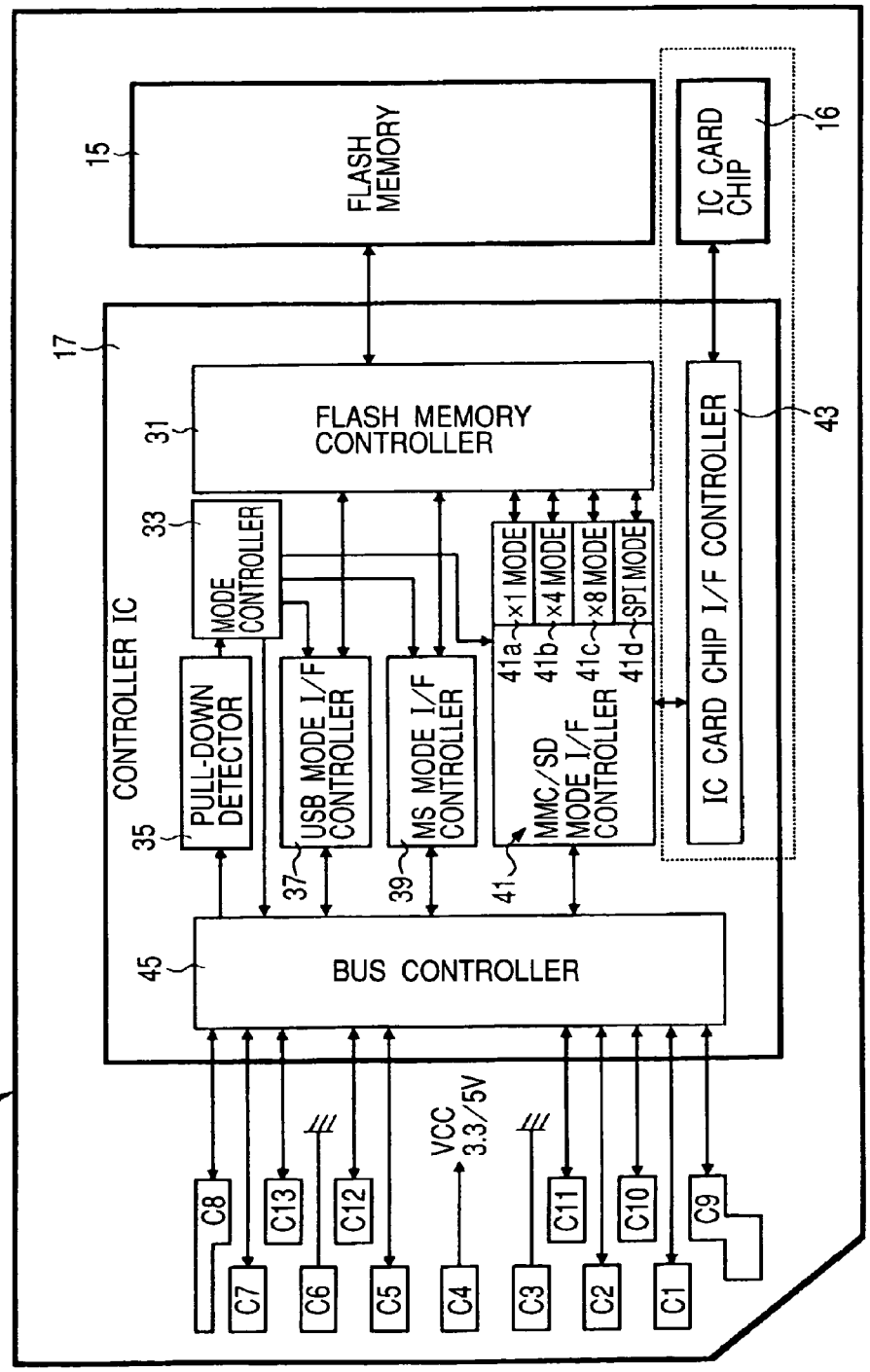
FIG. 7 is a block diagram showing the function of the IC card of the first embodiment.

Next, the internal function of the IC card based on this embodiment will be explained. FIG. 7 shows by block diagram the function of the IC card of this embodiment.

This IC card is of a first standard. Specifically, it is a multimedia card (MMC) standardized by the multimediacard association (MMCA).

This IC card is compatible with IC cards (SD memory cards) of a second standard, IC cards (memory sticks) of a third standard, and IC cards (USB-oriented memories) of a fourth standard. Namely, the IC card (MMC) of this embodiment is usable as an SD memory card, as a memory stick, and as a USB-oriented memory.

The SD (source digital) memory card, which is identical in profile and slightly thicker than MMC, is standardized by the SD card association to have the SD card standard.

The memory stick (MS) was developed by Sony Corp. to have the MS card standard.

USB is the abbreviation of universal serial bus, and it is the interface specifications for connecting easily a personal computer to its peripheral devices. Specifically, for example, mouse devices, keyboards, printers and modems are designed to have a common interface so that any of these devices can be connected to a personal computer through a common USB connector. A memory device having a USB connector can also be connected to a personal computer.

Many of conventional IC cards are not compatible with each other due to their different standards, whereas the IC card of this embodiment gains the compatibility with other IC cards as will be explained in detail in the following.

The IC card (MMC) 1 incorporates a flash memory 15, an IC card chip 16, and a controller IC 17.

The controller IC 17 includes a flash memory controller 31, a mode controller 33, a voltage pull-down detector 35, a USB-mode interface (I/F) controller 37, a MS-mode I/F controller 39, an MMC/SD-mode I/F controller 41, an IC card chip I/F controller 43, and a bus controller 45. The MMC/SD-mode I/F controller 41 has x1 bit mode 41a, x4 bit mode 41b, x8 bit mode 41c, and SPI mode 41d.

The flash memory 15 is connected to the flash memory controller 31, and the IC card chip 16 is connected to the IC card chip I/F controller 43.

The flash memory controller 31 is connected to the USB-mode I/F controller 37, MS-mode I/F controller 39, and MMC/SD-mode I/F controller 41.

The mode controller 33 is connected to the USB-mode I/F controller 37, MS-mode I/F controller 39, and MMC/SD-mode I/F controller 41, and it switches among the USB, MS and MMC/SD modes in accordance with the signal from the voltage pull-down detector 35.

The voltage pull-down detector 35 is connected to the external terminals Cn via the bus controller 45. The mode controller 33, USB-mode I/F controller 37, MS-mode I/F controller 39, and MMC/SD-mode I/F controller 41 are also connected to the external terminals Cn via the bus controller 45. Among the external terminals, C6 and C3 are ground voltage terminals and C4 is a supply voltage terminal.

The IC card of this embodiment includes the USB-mode I/F controller 37 and MS-mode I/F controller 39 within the controller IC 17, and therefore it can be used as MS and USB-oriented memories.

The IC card chip I/F controller 43 is connected to the MMC/SD-mode I/F controller 41 for example, and the controller 43 and IC card chip 16 are used to reinforce the security function of the card.

The mode switching operation of the mode controller 33 will be explained in detail in the following paragraph (5).

(1) A case of using the IC card (MMC) of this embodiment as an SD card will be explained. This IC card will be called "RS-MMC" for the distinction from the full-size IC card 1 which has been explained on FIG. 6.

In the usage of the RS-MMC 1 as an SD card, an SD-type card adapter (slot case) 50 is used.

Figure 8:
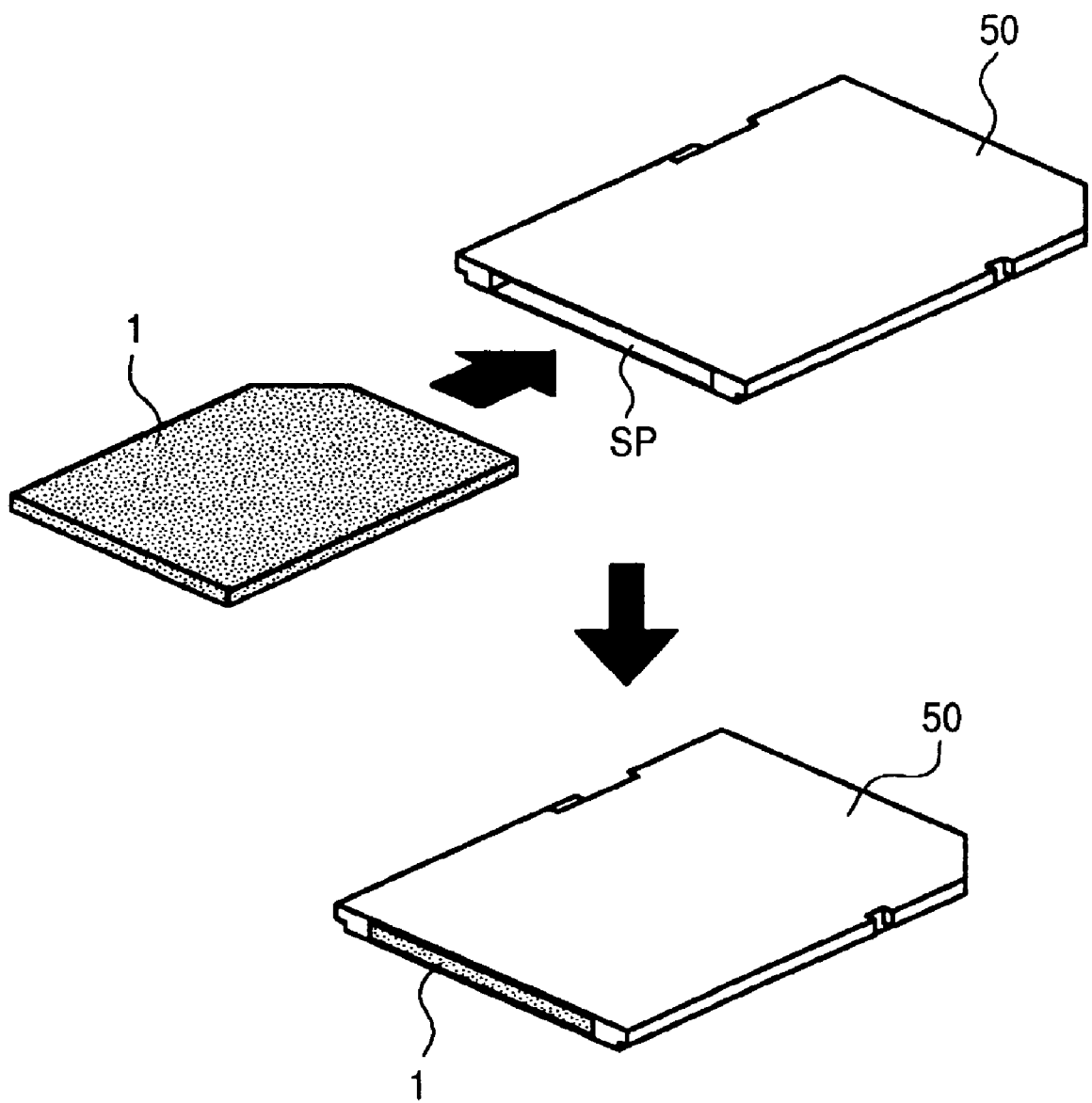
FIG. 8 is a set of perspective top views showing the setting of the IC card (RS-MMC) of the first embodiment in an SD-type adapter.
Figure 9:
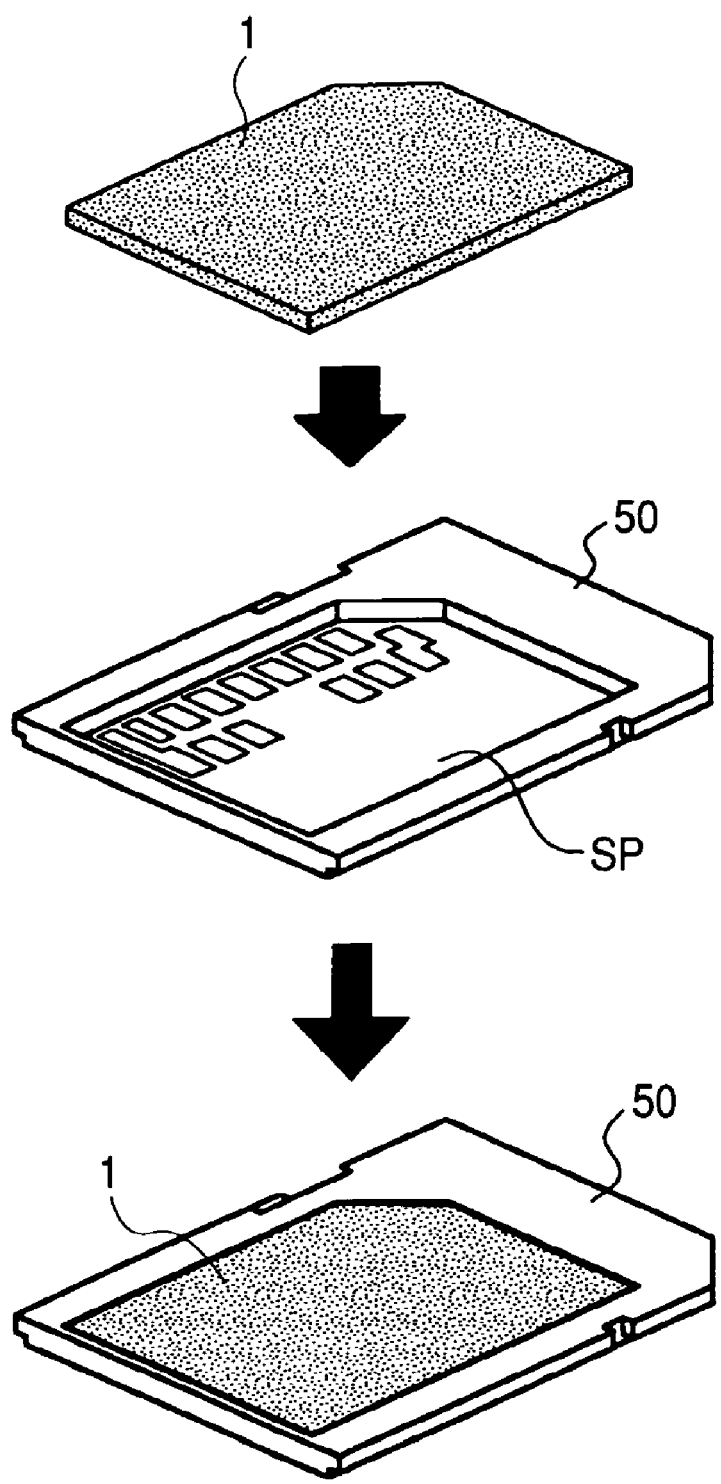
FIG. 9 is a set of perspective top views showing the setting of the IC card (RS-MMC) of the first embodiment in another SD-type adapter.
Figure 10:
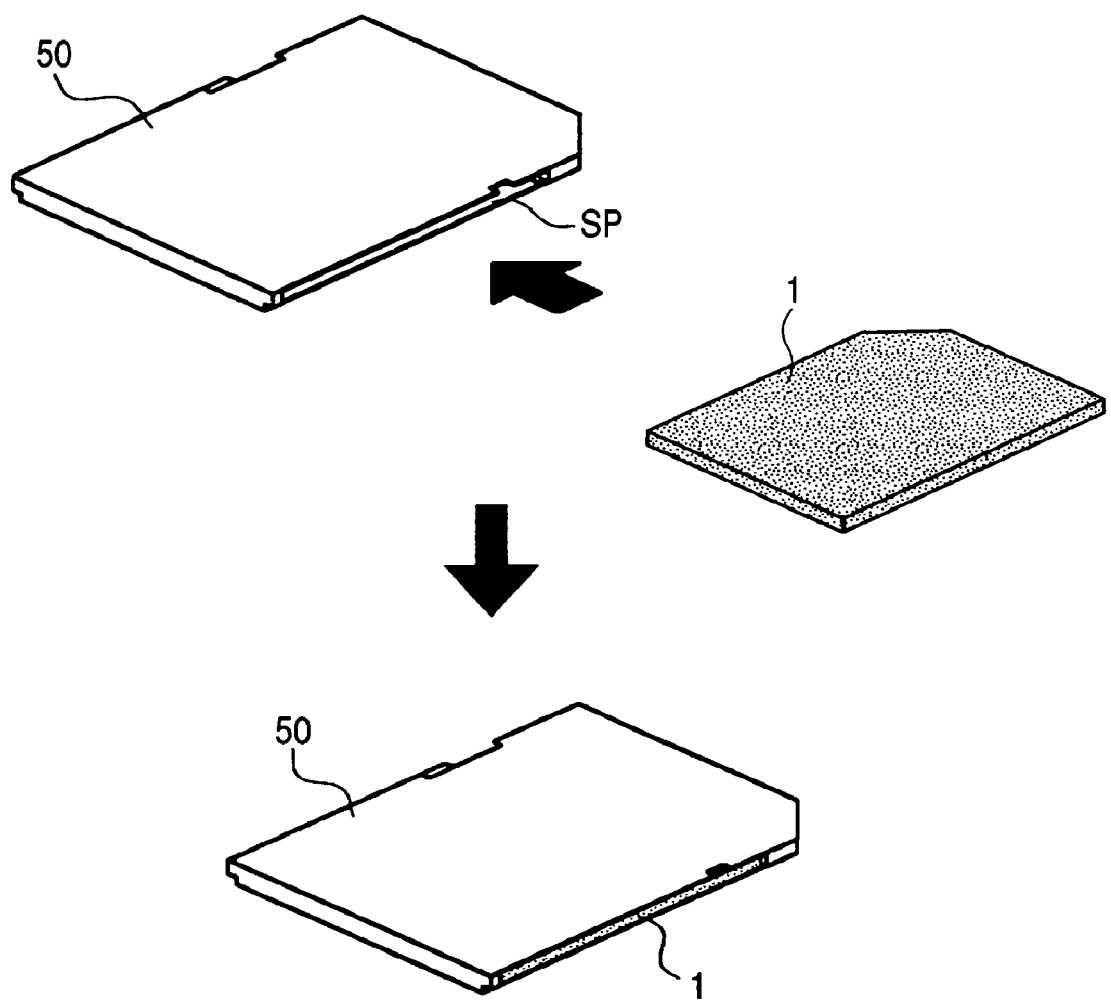
FIG. 10 is a set of perspective top views showing the setting of the IC card (RS-MMC) of the first embodiment in still another SD-type adapter.

FIG. 8 through FIG. 10 show perspectively the setting of an RS-MMC 1 in an SD-type adapter 50. Shown by FIG. 8 is card insertion from the short side of adapter, shown by FIG. 9 is card entry from the top of adapter, and shown by FIG. 10 is card insertion from the long side of adapter.

Figure 11:
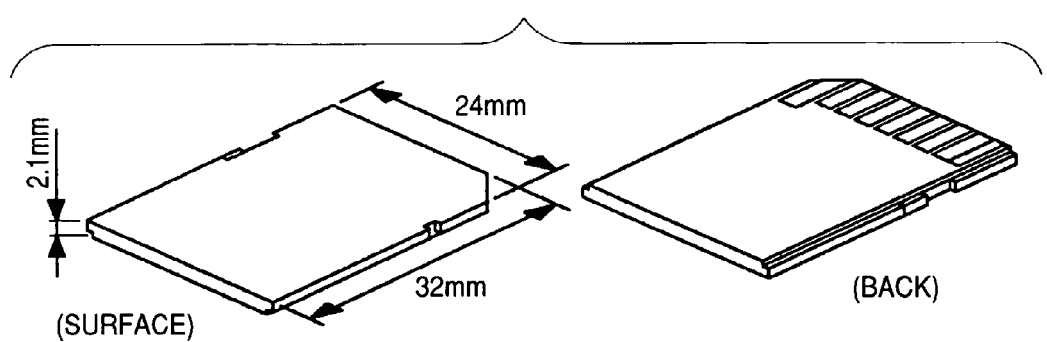
FIG. 11 is a perspective top view and perspective rear view of an SD card.

The SD-type adapter 50 has an interior space SP large enough to accommodate the RS-MMC 1 as shown in FIGS. 8-10, has virtually the same profile as an SD card with dimensions of about 24 mm by 32 mm and about 2.1 mm in thickness. FIG. 11 shows the top and rear of an SD card.

Figure 12:
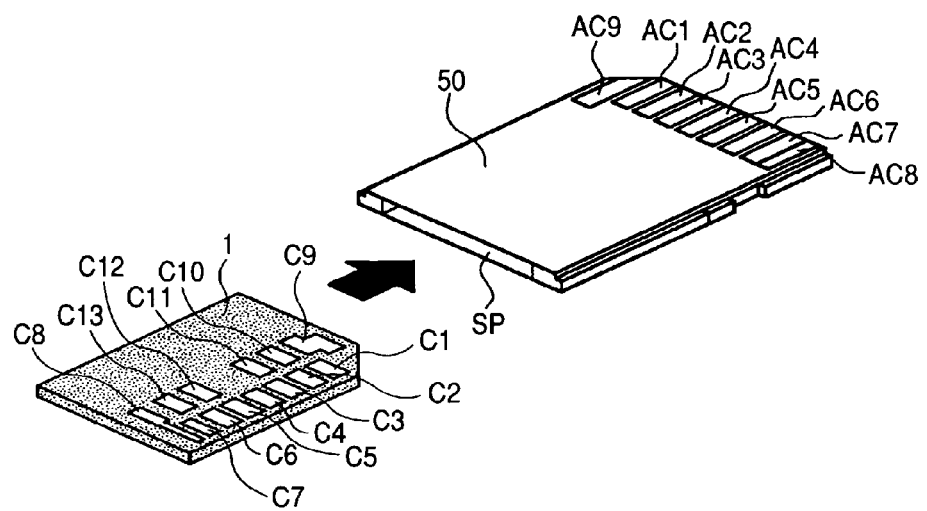
FIG. 12 is a perspective rear view of an SD-type adapter based on the first embodiment of this invention.

The SD-type adapter 50 has external terminals ACn (n=1 through 9) on the rear side as shown in FIG. 12. These external terminals are conductive strips exposed to the rear side of adapter, and have electrical conduction through wiring lines formed inside the adapter to the external terminals Cn of the RS-MMC which is set in the adapter.

Figure 13:
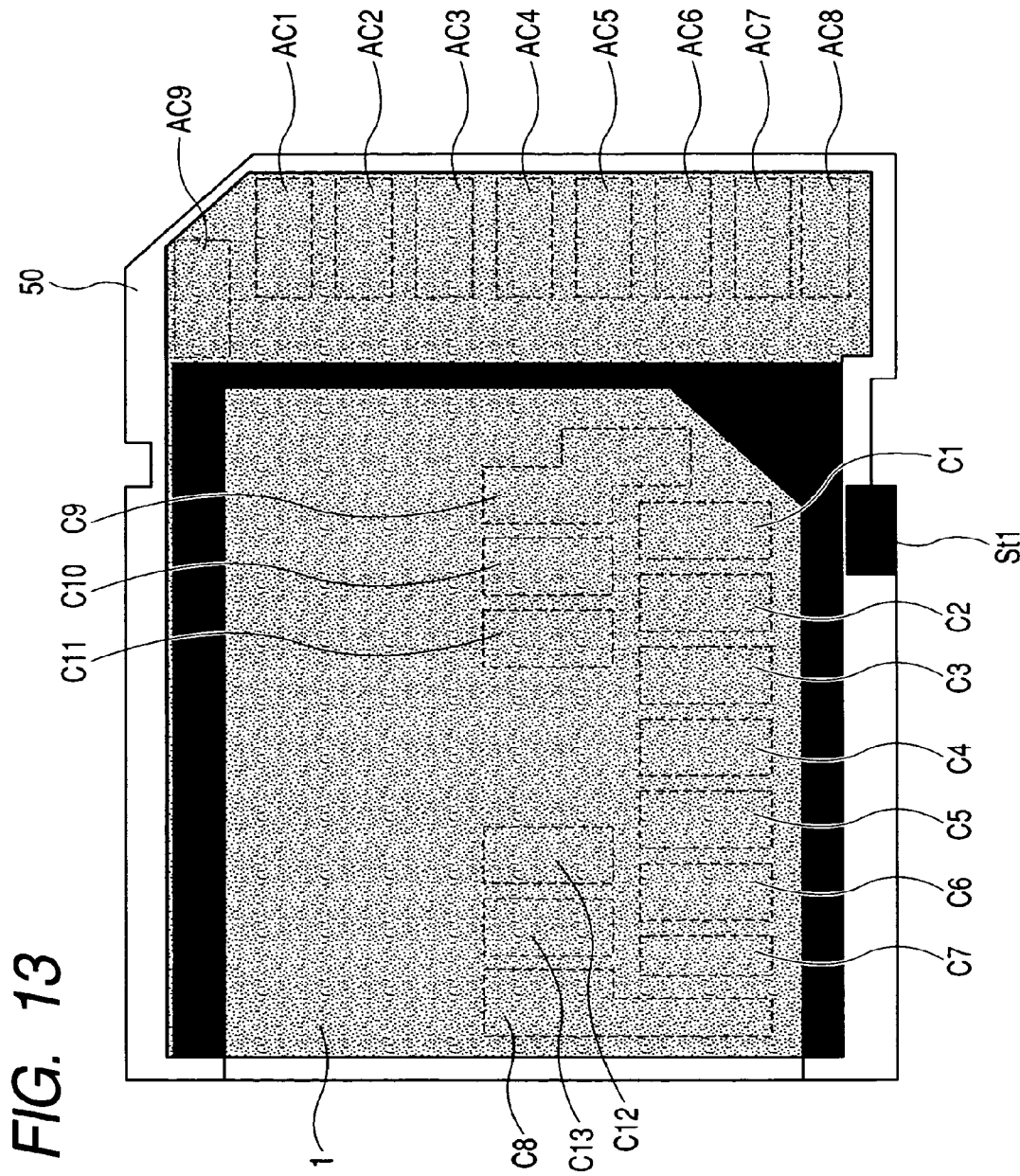
FIG. 13 is a principal plan view showing the SD-type adapter of the first embodiment, with an RS-MMC being set therein.
Figure 14:
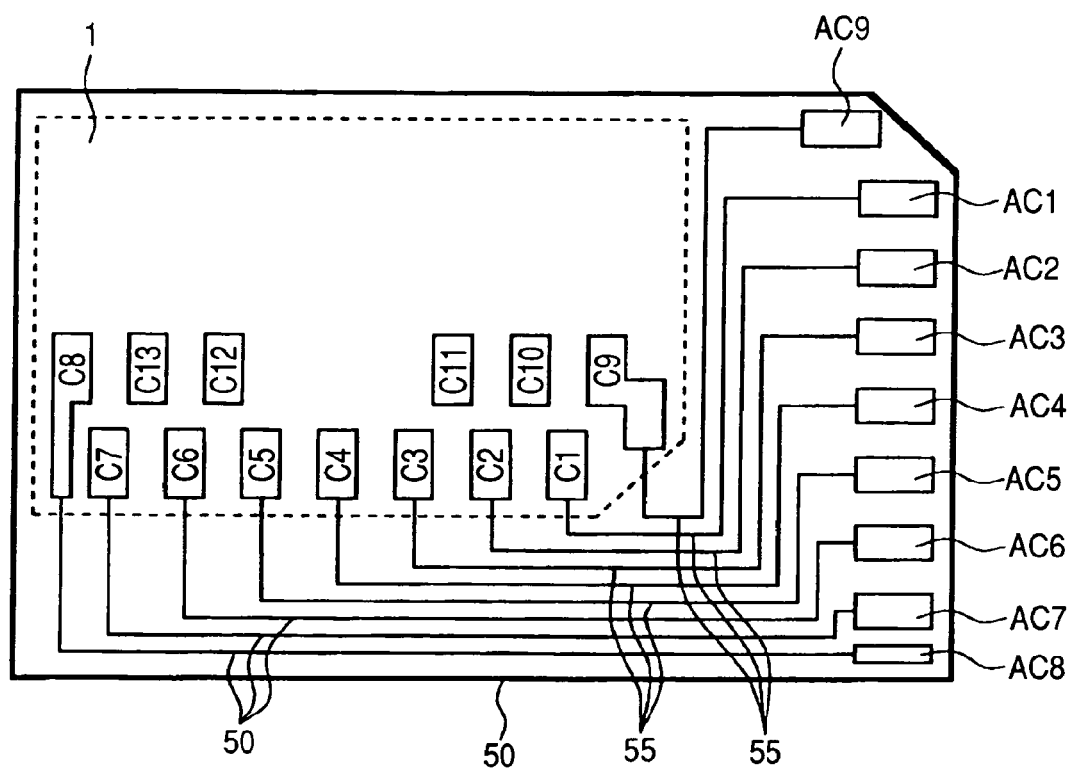
FIG. 14 is a plan view of the SD-type adapter of the first embodiment, showing the spatial relation of the external terminals of adapter, the external terminals of RS-MMC, and the wiring lines of the adapter for connecting between these terminals.

FIG. 13 shows in plan the RS-MMC 1 and SD-type adapter 50 in their set state, and FIG. 14 shows the spatial relation of the external terminals ACn (n=1-9) of the SD-type adapter 50, the external terminals Cn (n=1-13) of the RS-MMC 1, and the wiring lines of the adapter 50 for connecting between these terminals.

The external terminals AC1, AC2, AC3, AC4, AC5, AC6, AC7, AC8 and AC9 of the SD-type adapter 50 are conductive to the external terminals C1, C2, C3, C4, C5, C6, C7, C8 and C9 of the RS-MMC 1, respectively, for example.

The wiring lines 55 are formed inside the SD-type adapter 50 to run from the external terminals ACn to the positions (internal terminals) which are in contact with the external terminals Cn of the RS-MMC 1 when it is set in the adapter. The wiring lines 55 are formed inside the SD-type adapter 50 preferably on one layer by avoiding the line crossing, or may be formed on multiple layers for dealing with the line crossing.

In FIG. 13, indicated by St1 is a switch (slide switch). The SD-type adapter 50 changes its profile depending on the position of this switch. The host electronic appliance recognizes the change to enable or inhibit the data writing.

(2) Another case of using the IC card (RS-MMC) of this embodiment as an MS card will be explained.

(2-1) In the usage of the RS-MMC as an MS card, an MS-type card adapter is used.

Figure 15:
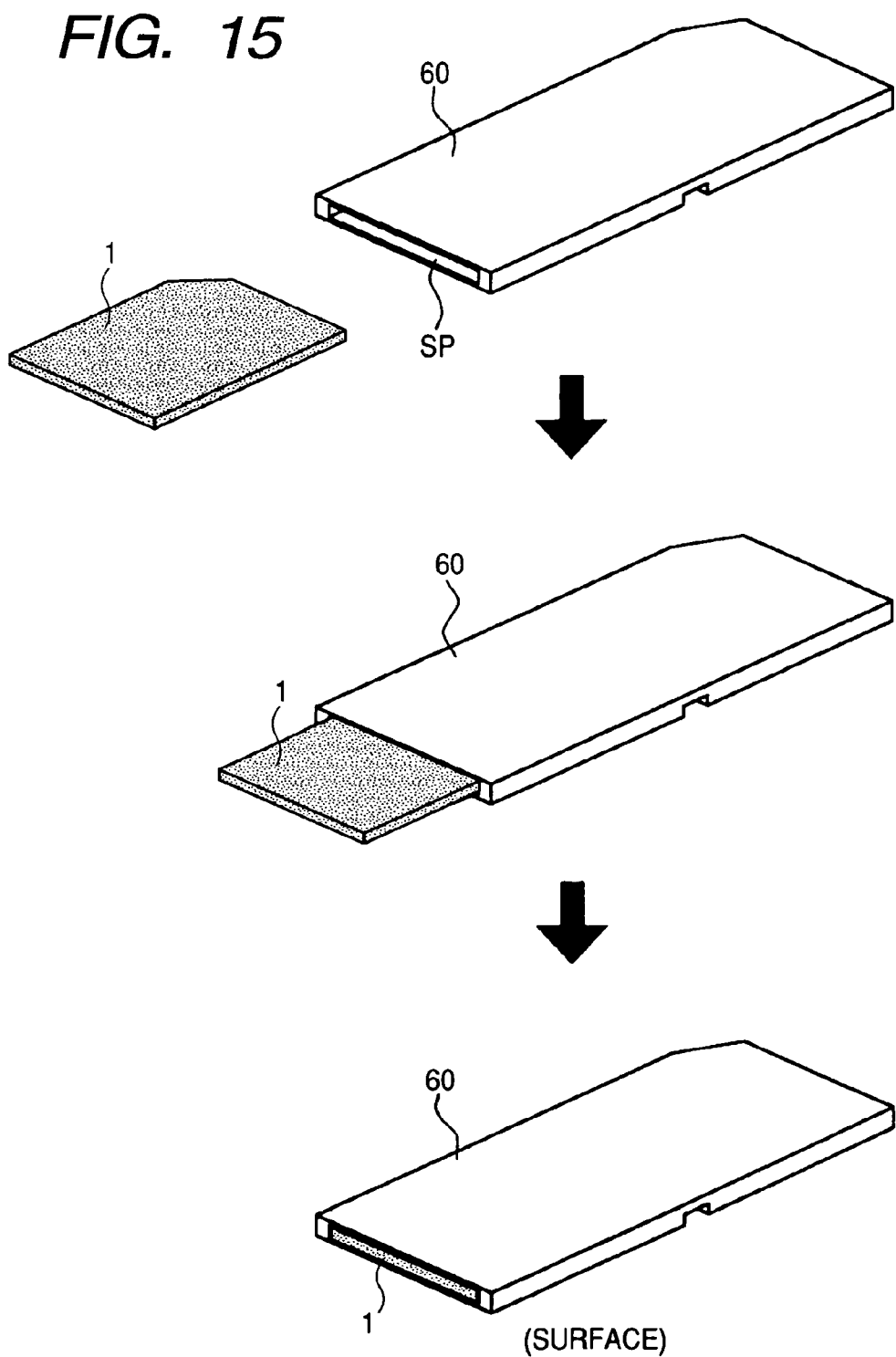
FIG. 15 is a set of perspective top views showing the setting of the IC card (RS-MMC) of the first embodiment in an MS-type adapter.
Figure 16:
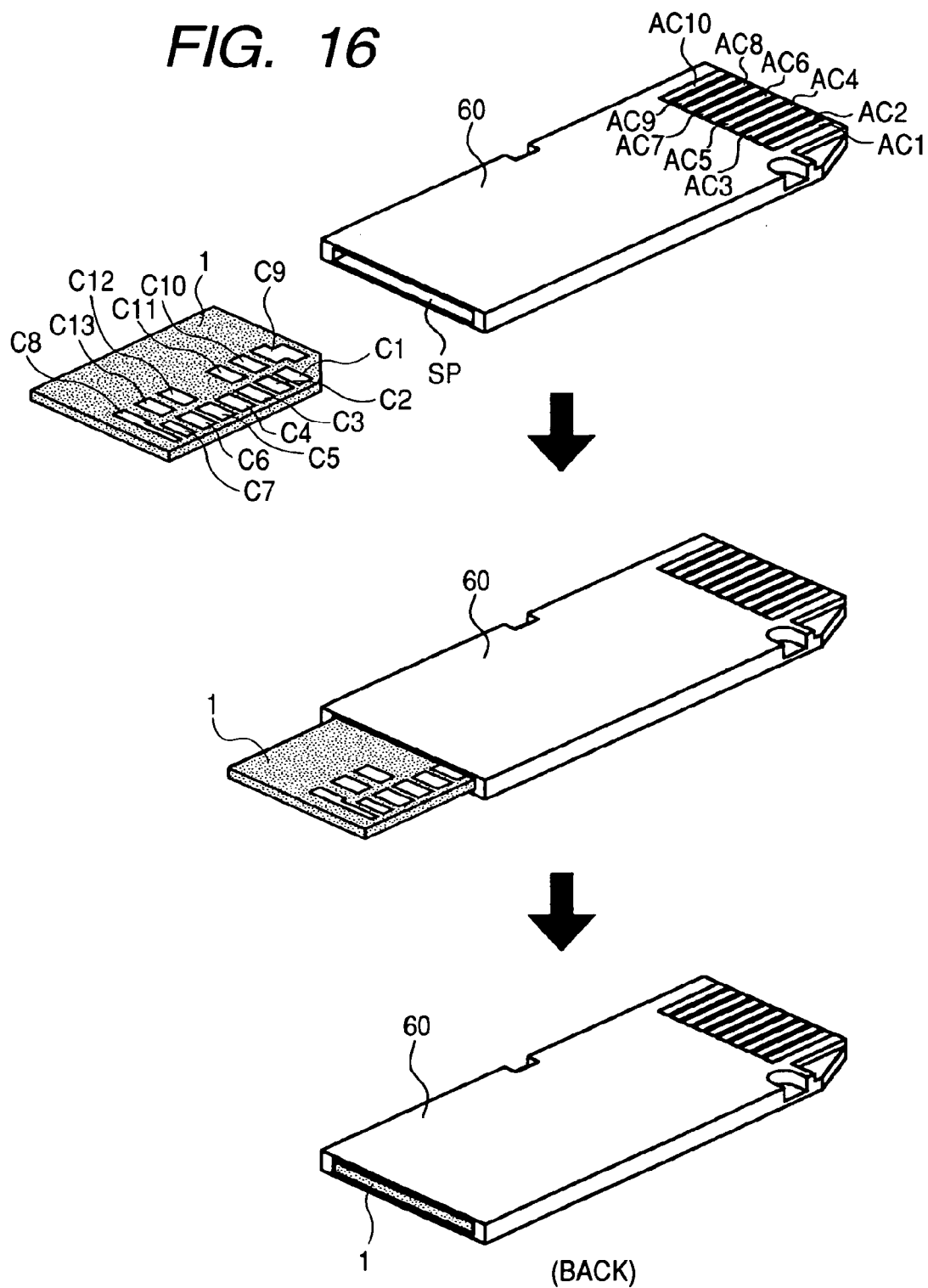
FIG. 16 is a set of perspective rear views showing the setting of the IC card (RS-MMC) of the first embodiment in the MS-type adapter.
Figure 17:
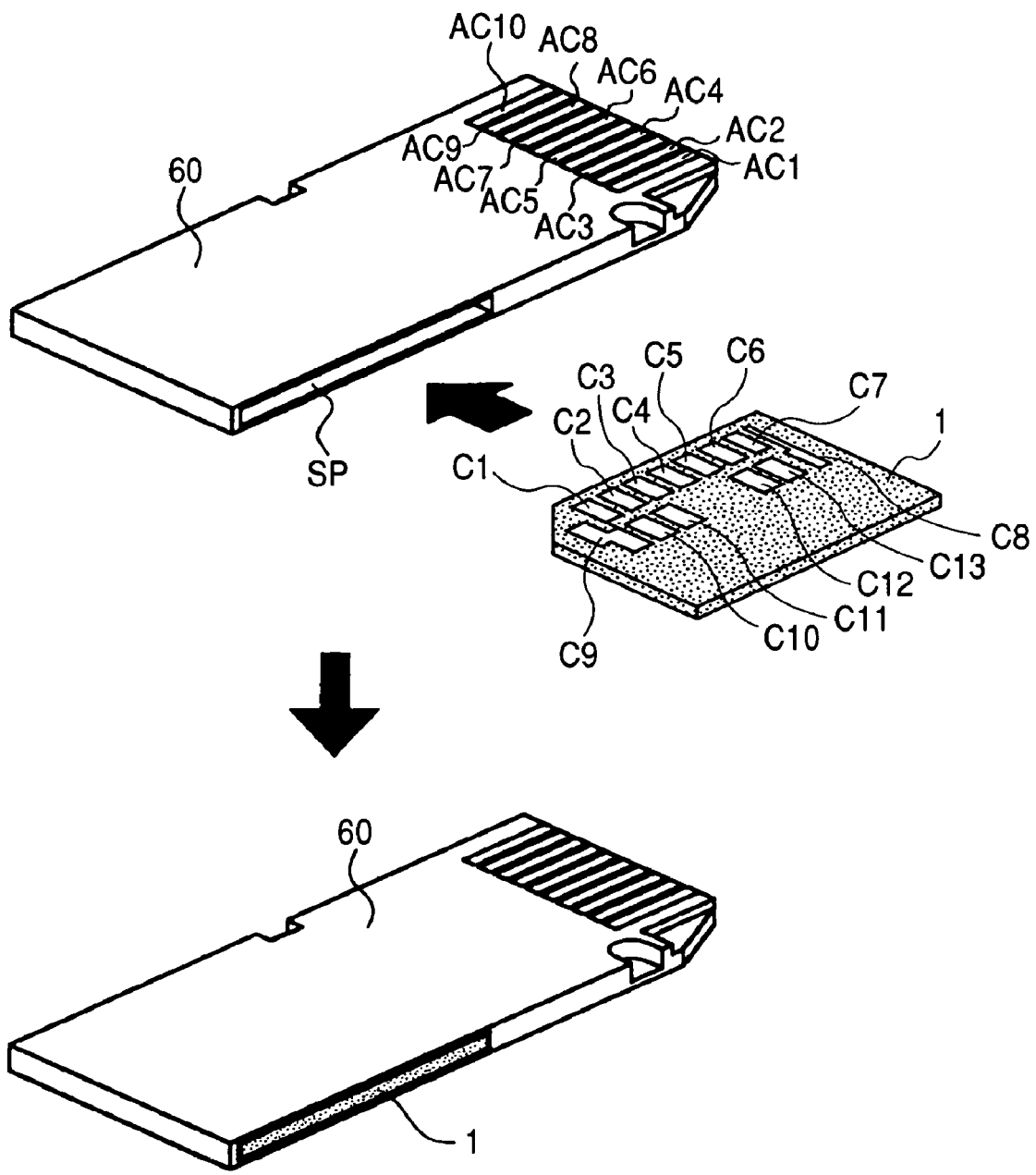
FIG. 17 is a set of perspective rear views showing the setting of the IC card (RS-MMC) of the first embodiment in another MS-type adapter.
Figure 18:
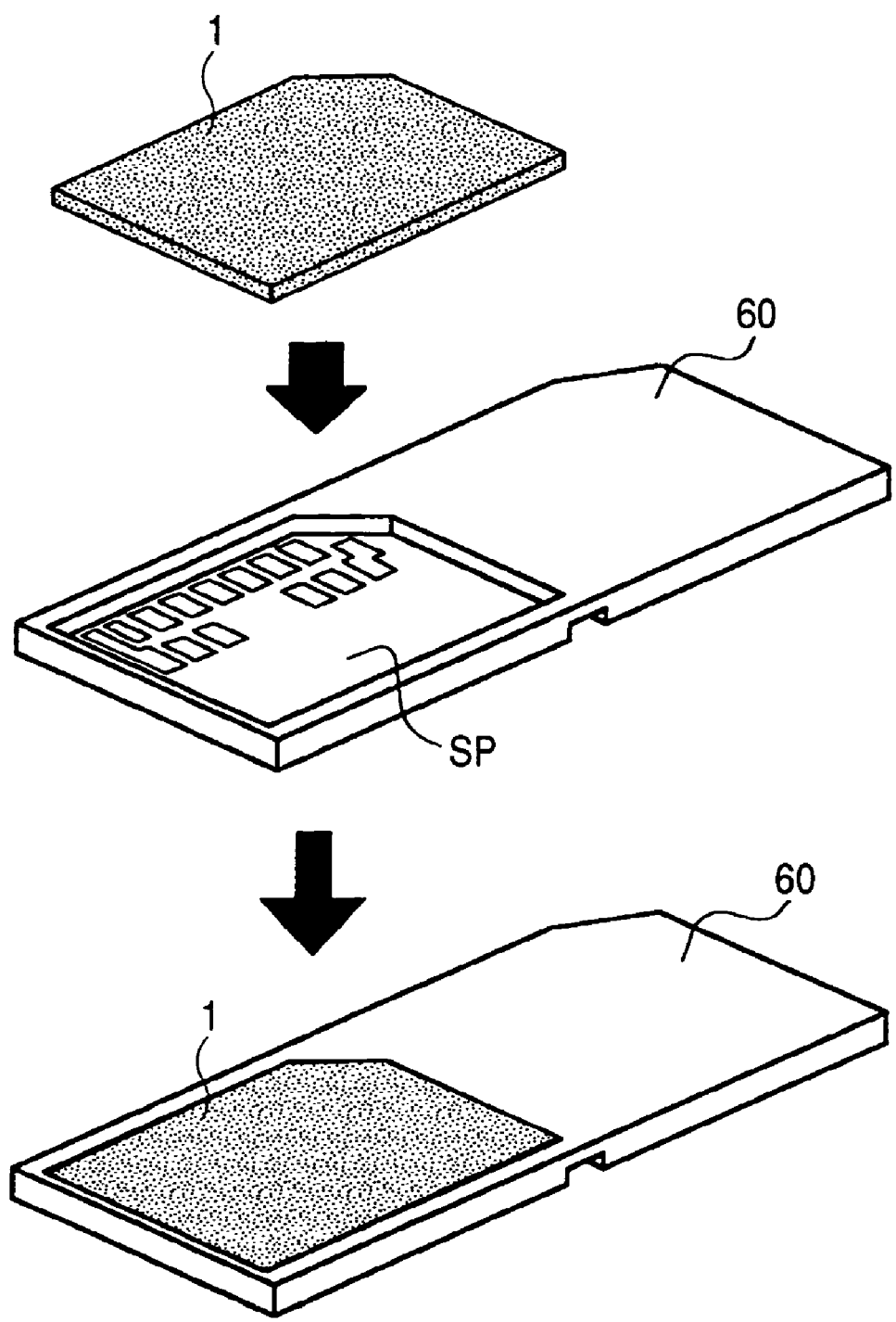
FIG. 18 is a set of perspective top views showing the setting of the IC card (RS-MMC) of the first embodiment in still another MS-type adapter.

FIG. 15 through FIG. 18 show perspectively the setting of an RS-MMC 1 in an MS-type adapter 60. Shown by FIGS. 15 and 16 is card insertion from the short side of adapter, shown by FIG. 17 is card insertion from the long side of adapter, and shown by FIG. 18 is card entry from the top of adapter.

Figure 19:
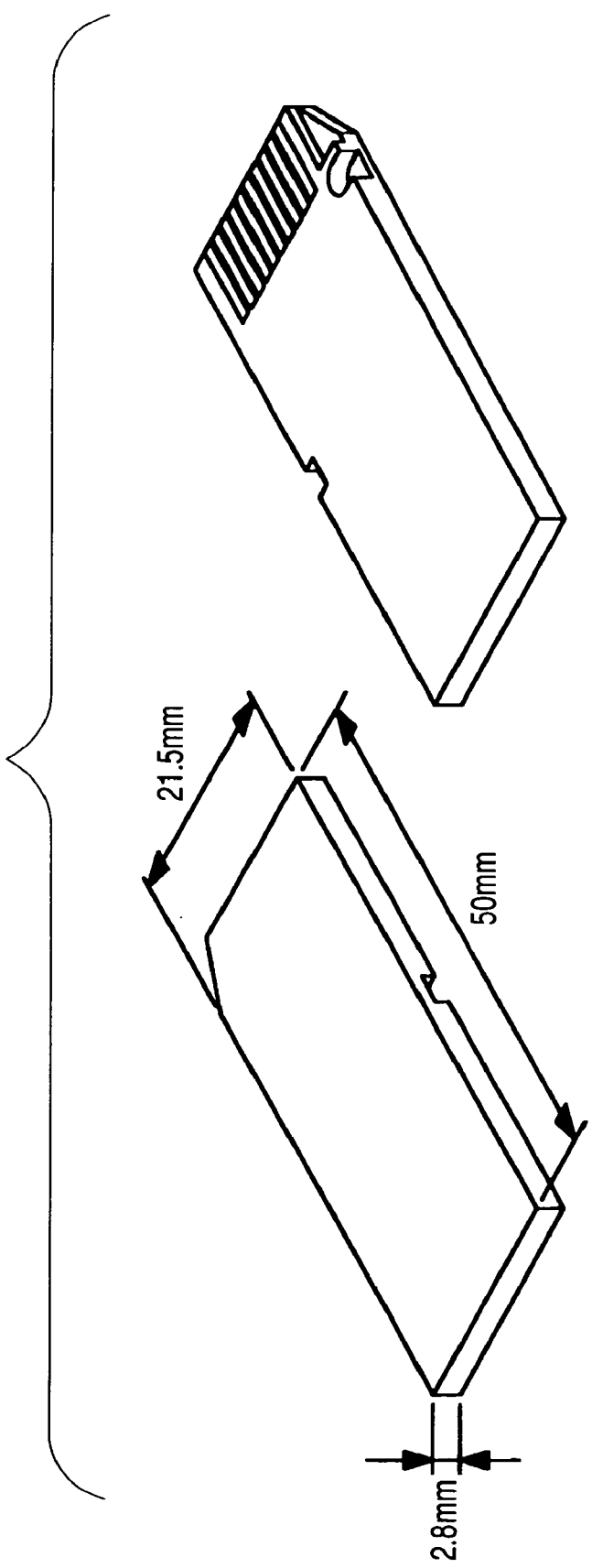
FIG. 19 is a perspective top view and perspective rear view of an MS card.

The MS-type adapter 60 has an interior space SP large enough to accommodate the RS-MMC 1 as shown in FIGS. 15-18, has virtually the same profile as an MS card with dimensions of about 21.5 mm by 50 mm and about 2.8 mm in thickness. FIG. 19 shows the top and rear of an MS card.

The MS-type adapter 60 has external terminals ACn (n=1 through 10) on the rear side as shown in FIGS. 16 and 17. These external terminals are conductive strips exposed to the rear side of adapter, and have electrical conduction through wiring lines formed inside the adapter to the external terminals Cn of the RS-MMC which is set in the adapter.

Figure 20:
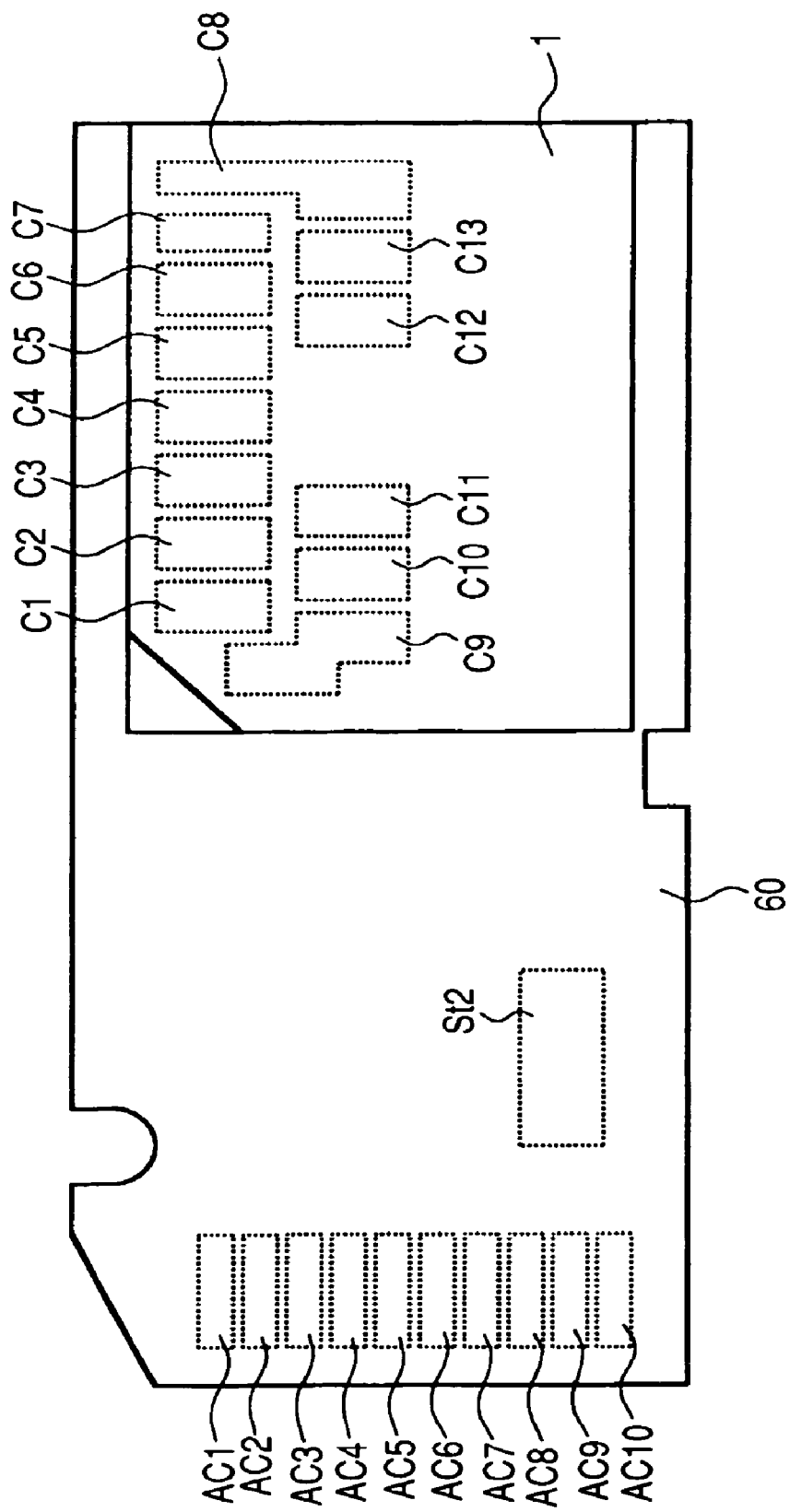
FIG. 20 is a principal plan view showing the MS-type adapter of the first embodiment, with an RS-MMC being set therein.
Figure 21:
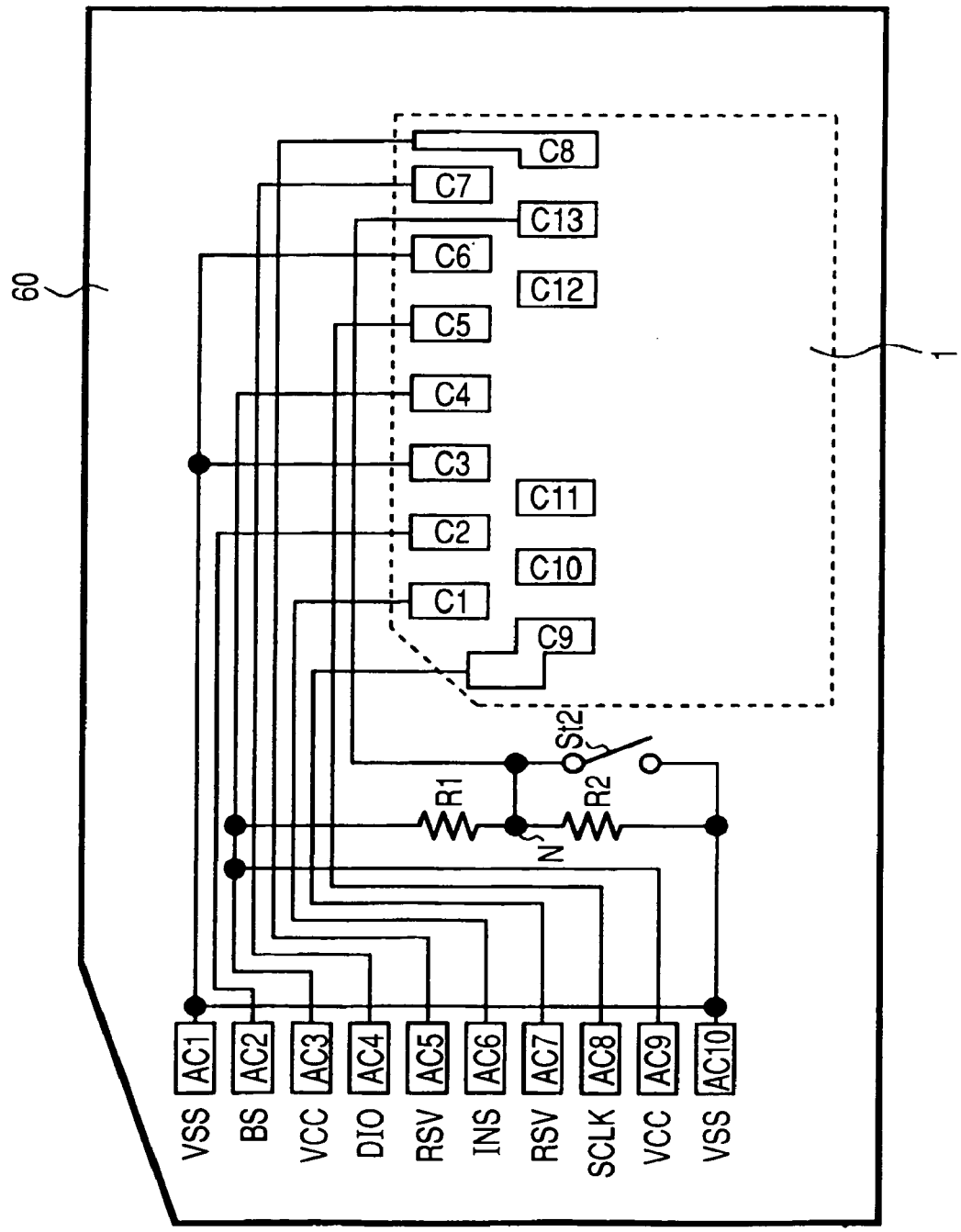
FIG. 21 is a plan view of the MS-type adapter of the first embodiment, showing the spatial relation of the external terminals of adapter, the external terminals of RS-MMC, and the wiring lines of the adapter for connecting between these terminals.

FIG. 20 shows in plan the RS-MMC 1 and SD-type adapter 60 in their set state, and FIG. 21 shows the spatial relation of the external terminals ACn (n=1-10) of the MS-type adapter 60, the external terminals Cn (n=1-13) of the RS-MMC 1, and the wiring lines of the adapter 60 for connecting between these terminals.

The external terminals AC1, AC2, AC3, AC4, AC5, AC6, AC7, AC8 and AC9 of the MS-type adapter 60 are conductive to the external terminals C3 and C6, C2, C4, C7, C8, C1, C9, C5 and C4 of the RS-MMC 1, respectively, for example. The MS-type adapter 60 has its terminals AC1 and AC10 connected to each other, and has its terminals AC3 and AC9 connected to each other.

The adapter has its terminals AC3 and AC10 connected through resistors R1 and R2 in serial connection, with the node N of the resistors being connected to the terminal AC10 through a switch St2 disposed on the rear surface of adapter and also conductive to the external terminal C13. The switch St2 is operated mechanically to connect or disconnect electrically between the resistor node and the terminal AC10.

Wiring lines are formed inside the MS-type adapter 60 to run from the external terminals ACn to the positions (internal terminals) which are in contact with the external terminals Cn of the RS-MMC 1 when it is set in the adapter. The wiring lines inside the adapter may be formed on multiple layers to deal with the line crossing as mentioned previously.

Based on the connection of the resistors R1 and R2 between the external terminal ACn of adapter and the external terminal Cn of RS-MMC, it is possible to recognize a voltage (pull-up voltage) which is slightly lower than the supply voltage or a voltage (pull-down voltage) which is slightly higher than the ground voltage on the external terminal Cn of RS-MMC, thereby facilitating the mode switching of RS-MMC.

The MS-type adapter has the application of various signal voltages on the external terminals ACn as indicated on the left-hand side of the terminals in FIG. 21. For example, the supply voltage (VCC) is fed to AC3, and the reference ground voltage (VSS) is fed to AC10. Individual signals will be explained in detail in the following paragraph (5).

Based on the assessment of as to whether or not the voltage on C13 is slightly higher (pulled down) than the ground voltage by a certain amount determined by the resistors, the functionality of the RS-MMC 1 as an MS card can be judged.

The MS-type adapter 60 has the switch St2 connected between the node N of the resistors R1 and R2 and the terminal AC10, enabling the voltage of C13 to change in response to the on/off state of the switch St2.

For example, C13 is pulled down completely when the switch St2 is on (write inhibit mode), or it is pulled down half when the switch St2 is off (write enable mode).

In this fashion, the write enable/inhibit mode can be switched in response to the degree of voltage pull-down on C13.

(2-2) The category of MS card includes a version of smaller profile called "memory stick Duo" (MSDuo) card.

In the case of using the RS-MMC as a MSDuo, a MSDuo-type card adapter is used.

Figure 22:
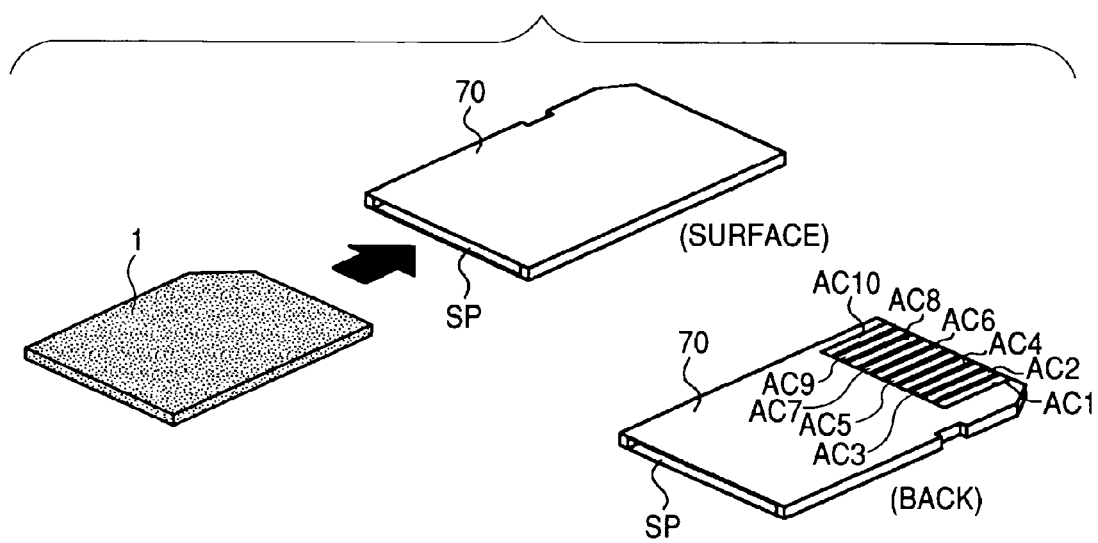
FIG. 22 is a perspective top view and perspective rear view showing the setting of the IC card (RS-MMC) of the first embodiment in an MSDuo-type adapter.
Figure 23:
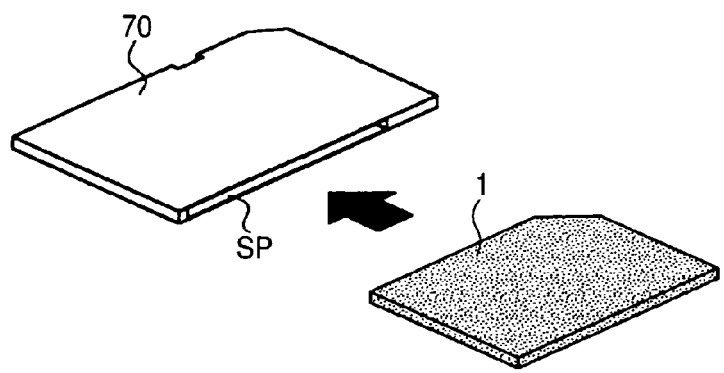
FIG. 23 is a perspective top view showing the setting of the IC card (RS-MMC) of the first embodiment in another MSDuo-type adapter.
Figure 24:
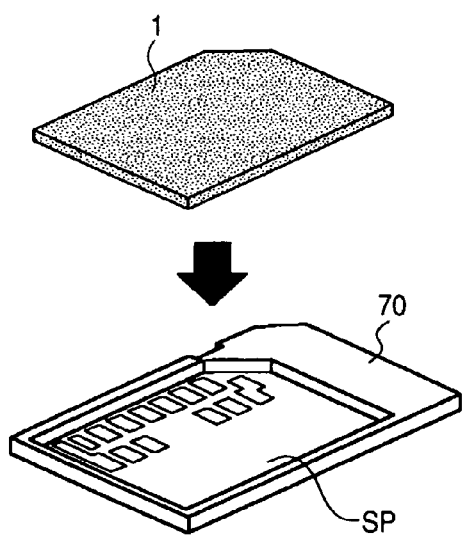
FIG. 24 is a perspective top view showing the setting of the IC card (RS-MMC) of the first embodiment in still another MSDuo-type adapter.

FIGS. 22 through FIG. 24 show perspectively the setting of an RS-MMC 1 in an MSDuo-type adapter 70. Shown by FIG. 22 is card insertion from the short side of adapter, shown by FIG. 23 is card insertion from the long side of adapter, and shown by FIG. 24 is card entry from the top of adapter.

Figure 25:
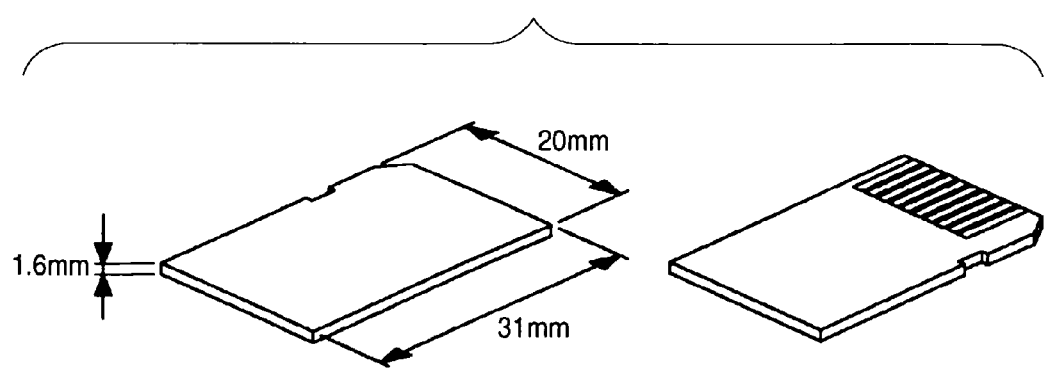
FIG. 25 is a perspective top view and perspective rear view of an MSDuo card.

The MSDuo-type adapter 70 has an interior space SP large enough to accommodate the RS-MMC 1 as shown in FIGS. 22-24, has virtually the same profile as an MSDuo card with dimensions of about 20 mm by 31 mm and about 1.6 mm in thickness. FIG. 25 shows the top and rear of an MSDuo card.

The MSDuo-type adapter 70 has external terminals ACn (n=1 through 10) on the rear side as shown in FIG. 22. These external terminals are conductive strips exposed to the rear side of adapter, and have electrical conduction through wiring lines formed inside the adapter to the external terminals Cn of the RS-MMC which is set in the adapter.

The external terminals ACn (n=1-10) of the MSDuo-type adapter 70, the external terminals Cn (n=1-13) of the RS-MMC 1, and the wiring lines of the adapter 70 for connecting between these terminals have the same spatial relation as the case of the MS-type adapter explained on FIG. 21, and explanation thereof is omitted.

Resistors R1 and R2 are connected between the external terminal ACn of the MS-type adapter and the external terminal Cn of the RS-MMC, so that the mode is switched in response to the presence or absence of voltage pull-down on the external terminal and the write enable/inhibit is switched in response to the degree of voltage pull-down, as in the case of the MS-type adapter.

(3) Another case of using the IC card (RS-MMC) of this embodiment as a USB-oriented memory will be explained.

In the usage of the RS-MMC as a USB-oriented memory, a USB-type card adapter (slot device with a USB terminal) is used.

Figure 26:
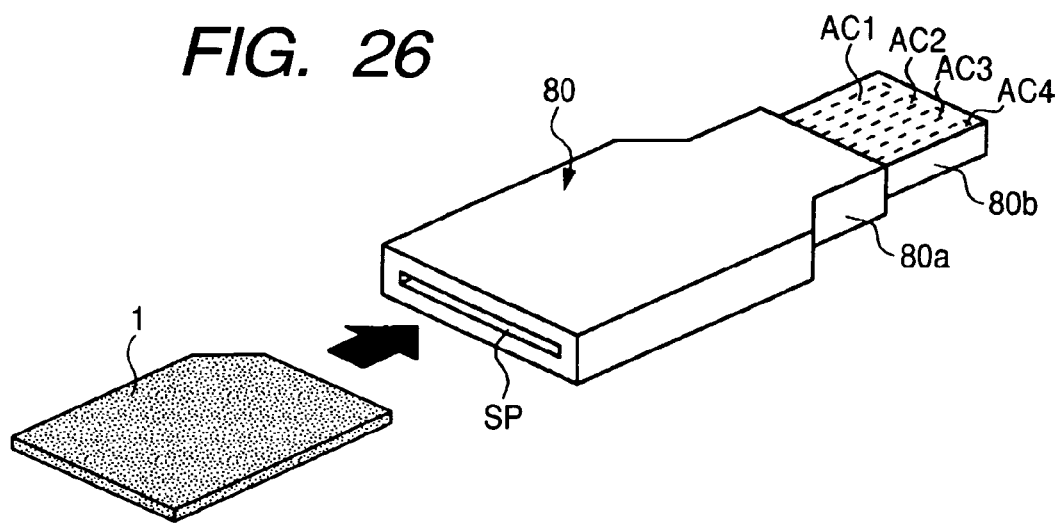
FIG. 26 is a perspective top view showing the setting of the IC card (RS-MMC) of the first embodiment in a USB-type adapter.
Figure 27:
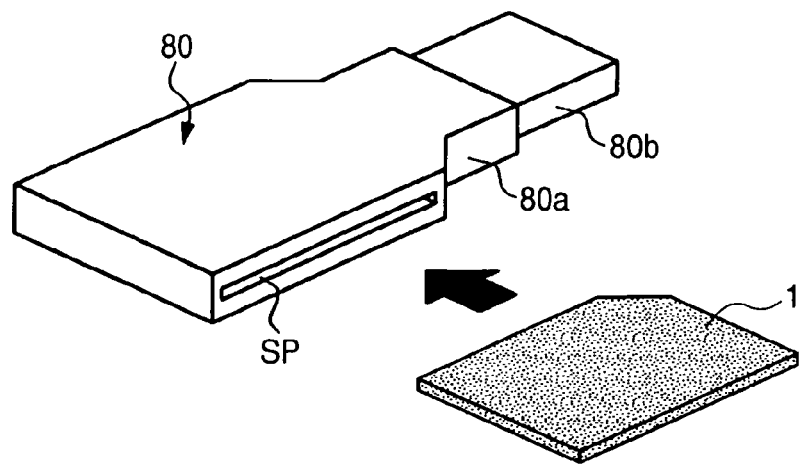
FIG. 27 is a perspective top view showing the setting of the IC card (RS-MMC) of the first embodiment in another USB-type adapter.
Figure 28:
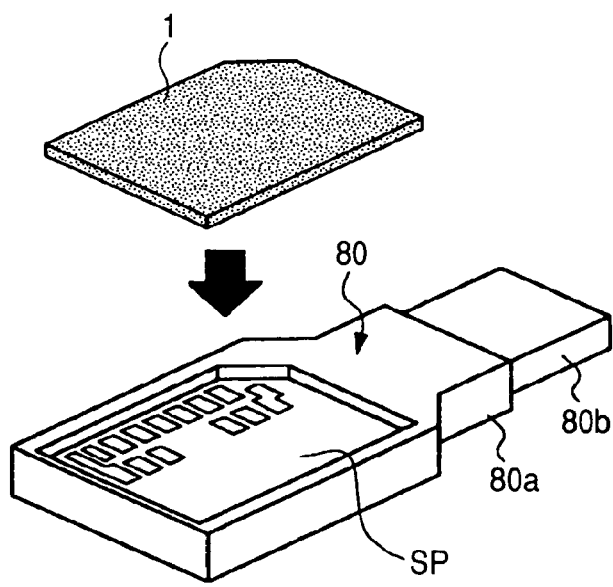
FIG. 28 is a perspective top view showing the setting of the IC card (RS-MMC) of the first embodiment in still another USB-type adapter.

FIG. 26 through FIG. 28 show perspectively the setting of an RS-MMC 1 in an USB-type adapter 80. Shown by FIG. 26 is card insertion from the short side of adapter, i.e., in the adapter plug-in direction, shown by FIG. 27 is card insertion from the long side of adapter, i.e., in the direction perpendicular to the adapter plug-in direction, and shown by FIG. 28 is card entry from the top of adapter.

The USB-type adapter 80 has an interior space SP large enough to accommodate the RS-MMC 1 as shown in FIGS. 22-28, and it consists of a case section 80*a* and a USB terminal section 80*b*.

The USB terminal section 80*b* has external terminals ACn (n=1 through 4) as shown in FIG. 26. These external terminals are conductive strips, and have electrical conduction through wiring lines formed inside the case section 80*a* to the external terminals Cn of the RS-MMC which is set in the adapter.

Figure 29:
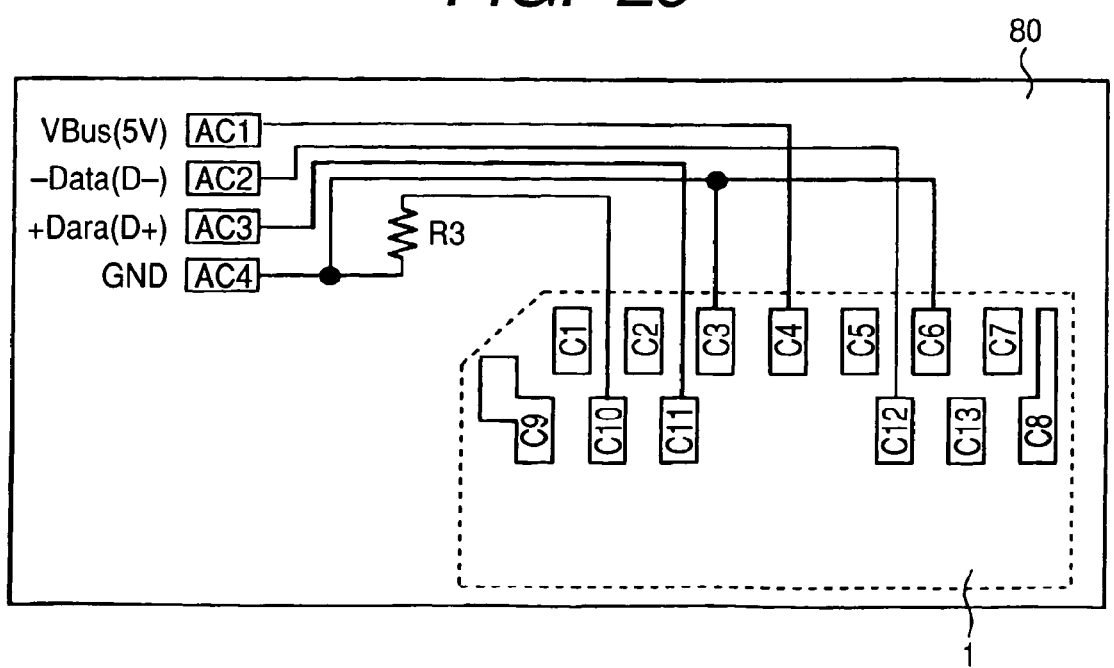
FIG. 29 is a plan view of an USB-type adapter based on the first embodiment of this invention, showing the spatial relation of the external terminals of adapter, the external terminals of RS-MMC, and the wiring lines in the case for connecting between these terminals.

FIG. 29 shows the spatial relation of the external terminals ACn (n=1-4) of the USB terminal section, the external terminals Cn (n=1-13) of the RS-MMC 1, and the wiring lines in the case section for connecting between these terminals.

The external terminals AC1, AC2, AC3 and AC4 of the USB terminal section are conductive to the external terminals C4, C12, C11, and C3 and C6 of the RS-MMC 1, respectively, for example. AC4 and AC10 are connected through a resistor R3.

Wiring lines are formed inside the case section to run from the external terminals ACn to the positions (internal terminals) which are in contact with the external terminals Cn of the RS-MMC when it is set in the adapter. The wiring lines inside the adapter may be formed on multiple layers to deal with the line crossing as mentioned previously.

Based on the connection of the resistor R3 between the external terminal ACn of adapter and the external terminal Cn of RS-MMC, it is possible to recognize a voltage (pull-up voltage) which is slightly lower than the supply voltage or a voltage (pull-down voltage) which is slightly higher than the ground voltage on the external terminal Cn of RS-MMC, thereby facilitating the mode switching of RS-MMC. The USB-type adapter has the application of various signal voltages on the external terminals ACn as indicated on the left-hand side of the terminals in FIG. 29. AC4 has the application of the ground voltage (GND).

Based on the assessment of as to whether or not the voltage on C10 is slightly higher (pulled down) than the ground voltage by a certain amount determined by the resistor, the functionality of the RS-MMC as a USB-oriented memory can be judged.

(4) In the case of using the IC card (RS-MMC) 1 of this embodiment as a full-size MMC, the card extender 9 which has been explained on FIG. 6 is used. The RS-MMC 1, with the extender 9 being attached, is put into the slot of a host electronic appliance, and the external terminals Cn (n=1-13) of RS-MMC come in contact with the terminals of appliance to allow signal transaction. The extender 9 shown in FIG. 6 has neither wiring lines nor interior space.

Obviously, when the RS-MMC 1 without the extender 9 is put directly into the slot of host electronic appliance, the external terminals Cn (n=1-13) of RS-MMC come in contact with the terminals of appliance to allow signal transaction.

The adapters explained in the foregoing paragraphs (1)-(4) have casings of resin which house wiring boards. The wiring board is a glass-epoxy plate, with a copper layer being formed on the surface, and the copper layer is etched to form wiring lines. The wiring lines are connected to the internal terminals which will be in contact with the external terminals of the RS-MMC when it is set in the adapter, and parts of the wiring lines form the adapter external terminals which are exposed to the outside through an opening of the casing. The internal terminals are preferably formed of bent metallic plates or provided with a spring action means so that the internal terminals exerts a pushing force on the external terminals Cn (n=1-13) of RS-MMC.

(5) Next, the mode switching operation of the IC card (RS-MMC) of this embodiment which takes place when the card is put into the slot of a host appliance directly or by being set in any of the foregoing adapters will be explained.

Figure 30:
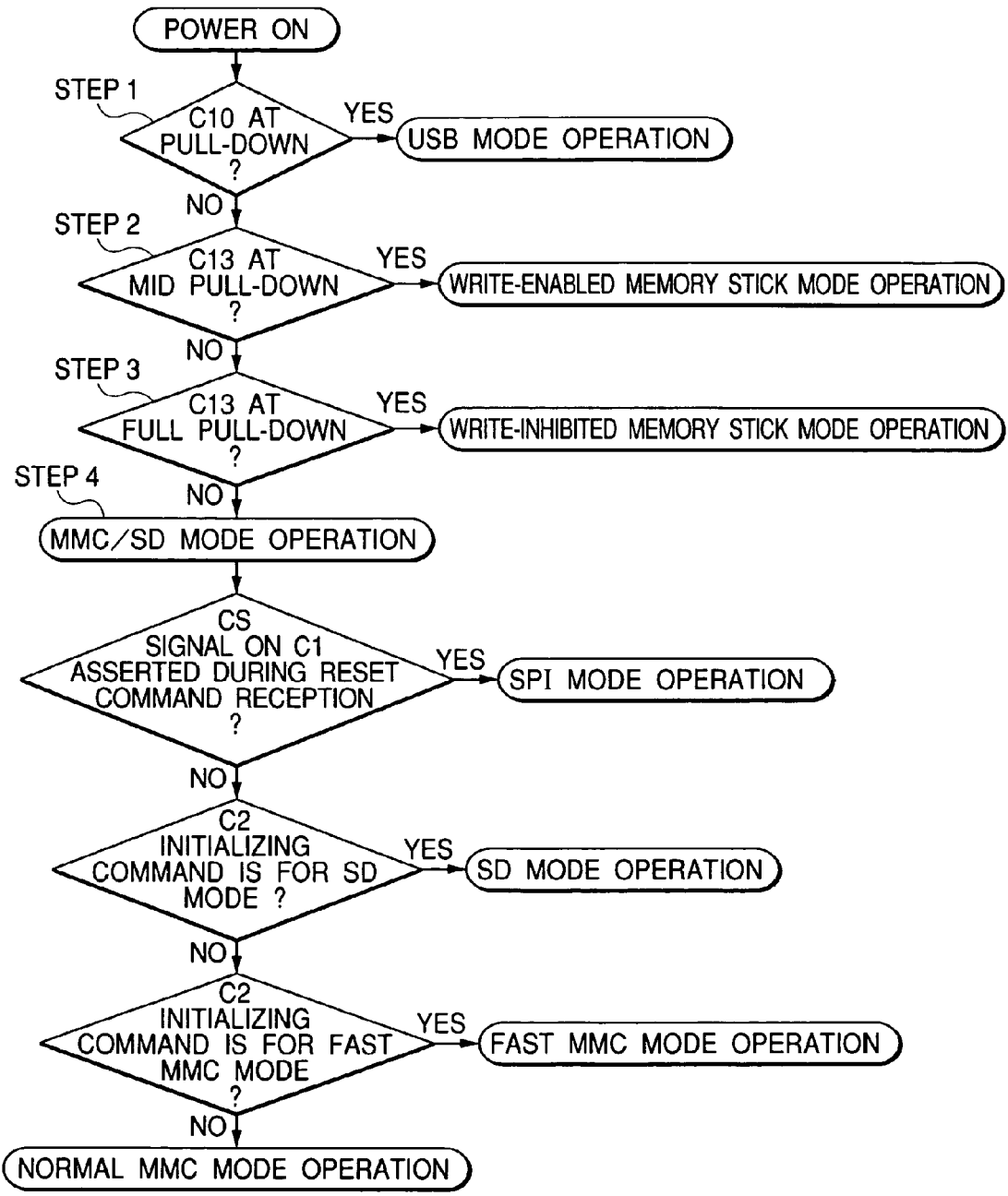
FIG. 30 is a flowchart showing the mode switching operation of the controller of the IC card of the first embodiment.

FIG. 30 shows by flowchart the mode determining operation by the controller IC 17 shown in FIG. 7 and the function switching operation for the controller IC 17 in accordance with the determined mode.

The host appliance, with the IC card (RS-MMC) 1 being placed in its card slot, is turned on, and it starts the card setup operation to feed the ground voltage (VSS or GND) to external terminals C3 and C6 of RS-MMC and the supply voltage (VCC) to terminal C4.

Step 1: The voltage pull-down detector 35 judges whether or not the external terminal C10 is at pull-down. In response to pull-down on the terminal C10, which is the case where the USB-type adapter 80 explained on FIG. 29 is attached to the RS-MMC 1, the controller 33 selects the USB mode.

Figure 31:
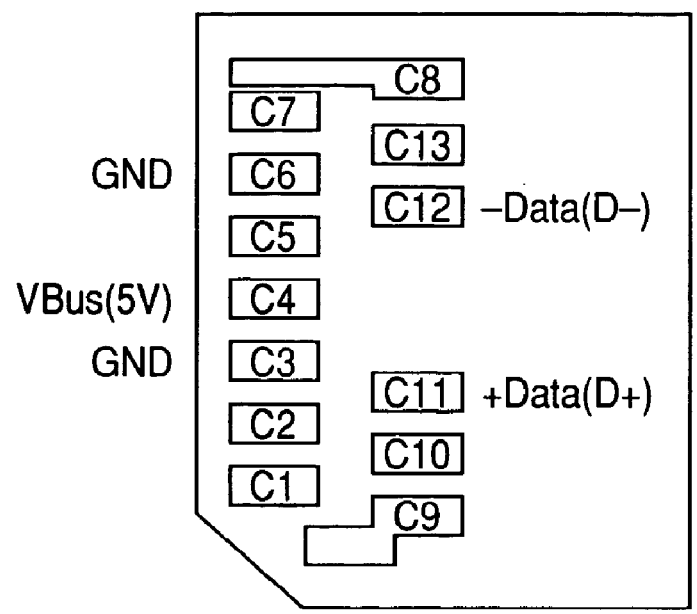
FIG. 31 is a plan view of the IC card of the first embodiment, showing the relation between the external terminals Cn and the signals when the USB-mode interface controller is selected.

Subsequently, the USB-mode I/F controller assigns the +Data and −Data terminals to external terminals C11 and C12, respectively, of the RS-MMC as shown in FIG. 31. +Data is the data signal, and −Data is the inverted version of the signal. Terminal C3 and C6 are of the ground voltage, and terminal C4 is the VBus terminal of the supply voltage, e.g., 5 V.

Step 2: If terminal C10 is not at pull-down, the pull-down detector 35 judges whether or not terminal C13 is at mid pull-down. In response to mid pull-down on terminal C13, i.e., having a mid pull-down voltage, which is the case where the MS-type adapter 60 or MSDuo-type adapter 70 explained on FIG. 21 is attached to the RS-MMC 1, the controller 33 selects the MS mode. In the case of mid pull-down, the switch St1 is off, and then write-enable mode is set.

Figure 32:
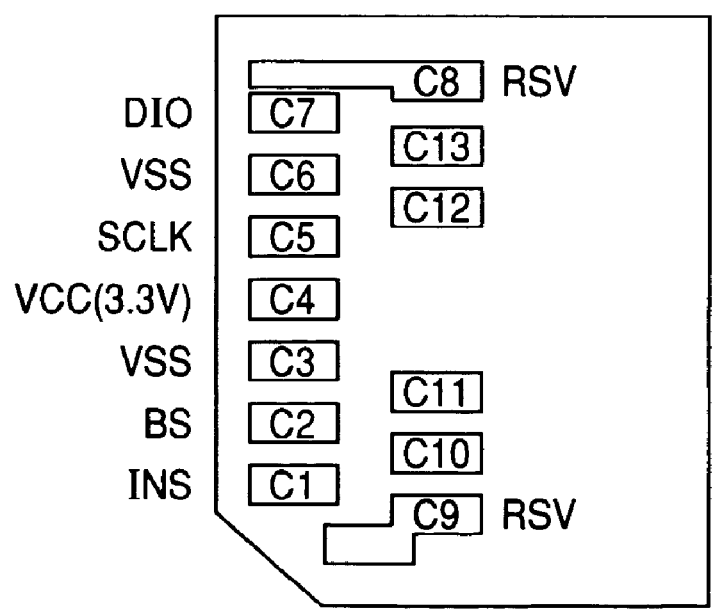
FIG. 32 is a plan view of the IC card of the first embodiment, showing the relation between the external terminals Cn and the signals when the MS-mode interface controller is selected.

Subsequently, the MS-mode I/F controller assigns the INS, BS, SCLK, DIO, and RSV terminals to external terminals C1, C2, C5, C7, and C8 and C9, respectively, of the RS-MMC as shown in FIG. 32.

INC is the memory stick attach/detach detection signal, BS is the serial protocol bus state signal, SCLK is the serial protocol clock signal, and DIO is the serial protocol data signal. Terminal RSV is for reservation. Terminals C3 and C6 are of the ground voltage (VSS), and terminal C4 is of the supply voltage (VCC), e.g., 3.3 V.

Step 3: If terminal C13 is not at mid pull-down, the pull-down detector 35 judges whether or not pull-down is full pull-down. In response to pull-down on terminal C13, i.e., having a voltage further lower than the mid pull-down voltage, which is the case where the MS-type adapter 60 or MSDuo-type adapter 70 is attached to the RS-MMC 1, the controller 33 selects the MS mode. In the case of full pull-down, the switch St1 is on, and then write-inhibit mode is set.

Subsequently, the MS-mode I/F controller assigns the signal terminals to the external terminals Cn as explained on FIG. 32.

Step 4: If terminal C13 is not at full pull-down, which is the case where the SD-type adapter 50 explained on FIGS. 13 and 14 or the card extender 9 explained on FIG. 6 is attached to the RS-MMC 1 or the RS-MMC 1 has no attachment, the controller 33 selects the MMC/SD mode.

Subsequently, the SPI mode, x4 bit mode (SD mode), x8 bit mode (fast MMC mode), or x1 bit mode (normal MMC mode) is selected as follows.

Step 4-1: During the reception of reset command on terminal C2, it is checked whether or not the chip select signal (CS) on terminal C1 is asserted.

In case the CS signal is asserted, the MMC/SD-mode I/F controller 41 selects the SPI mode 41*d*. In the SPI mode, different from other MMC (1 bit or 8 bit) modes, the command signal is transferred in one direction.

Figure 33:
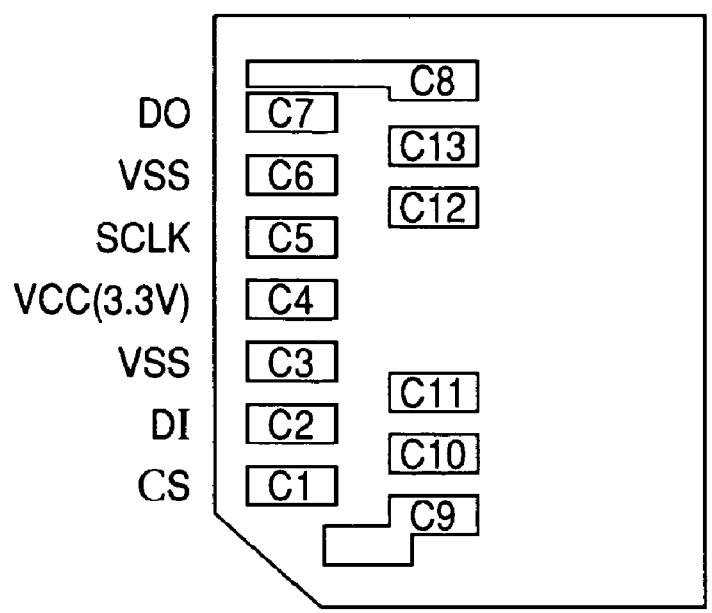
FIG. 33 is a plan view of the IC card of the first embodiment, showing the relation between the external terminals Cn and the signals when the MMC/SD-mode interface controller is selected.

The external terminals Cn and the signal terminals are related as shown in FIG. 33. Specifically, external terminals C2, C5 and C7 of RS-MMC are the DI, SCLK and DO signal terminals, respectively. DI is the input data signal, and DO is the output data signal. Terminal C1 is for the CS signal, C3 and C6 are for the VSS voltage, and C4 is for the VCC voltage.

Step 4-2: When the CMD (start command) signal of the SD mode (x4 bit mode) is put in to terminal C2, the controller 33 makes a response of readiness of SD mode starting and selects the SD mode (x4 bit mode) 41*b*.

Figure 34:
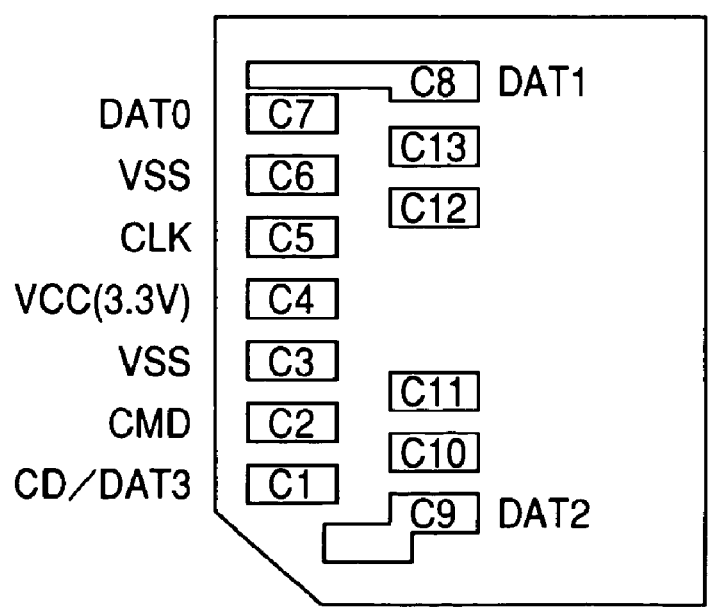
FIG. 34 is a plan view of the IC card of the first embodiment, showing the relation between the external terminals Cn and the signals when the MMC/SD-mode interface controller is selected and the 4-bit mode is selected.

The external terminals Cn and the signal terminals are related as shown in FIG. 34. Specifically, external terminals C1, C5, C7, C8, and C9 of RS-MMC are the CD/DAT3, CLK, DAT0, DAT1, and DAT2 signal terminals, respectively. CD/DAT3 is either the card detect (CD) signal indicating the setting of memory card in the host appliance, or the third data signal (DAT3). DAT0, DAT1, and DAT2 are the 0-th data signal, first data signal, and second data signal, respectively. Terminal C2 is for the CMD signal, C3 and C6 are for the VSS voltage, and C4 is for the VCC voltage.

Step 4-3: When the CMD (start command) signal of the fast MMC mode (x8 bit mode) is put in to terminal C2, the controller 33 selects the fast MMC mode (x8 bit mode) 41*c*.

Figure 35:
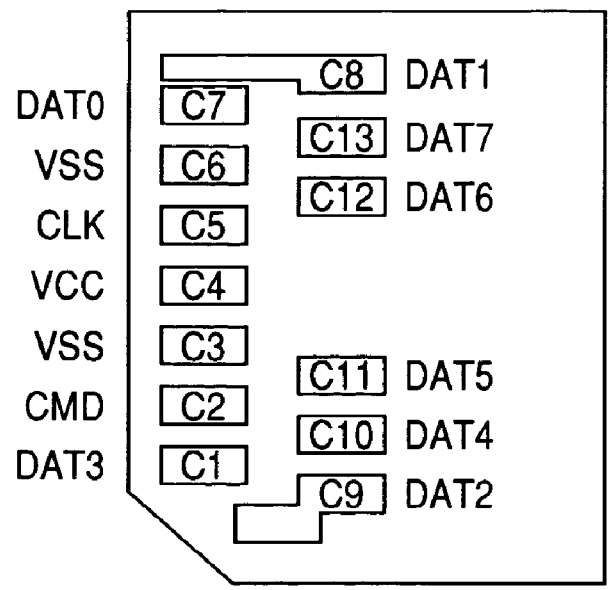
FIG. 35 is a plan view of the IC card of the first embodiment, showing the relation between the external terminals Cn and the signals when the MMC/SD-mode interface controller is selected and the 8-bit mode is selected.

The external terminals Cn and the signal terminals are related as shown in FIG. 35. Specifically, external terminals C1, C5, C7, and C8-C13 of RS-MMC are the DAT3, CLK, DAT0, and DAT1-DAT2 and DAT4-DAT7 signal terminals, respectively. Terminal DAT0 is for the 0 th data signal, terminals DAT1-DAT7 are for the first through seventh signals, terminal C2 is for the CMD signal, C3 and C6 are for the VSS voltage, and C4 is for the VCC voltage.

Step 4-4: In the case of the absence of assertion of the CS signal and input of the CMD (start command) signal of SD mode (x4 bit mode) or CMD (start command) signal of fast MMC mode (x8 bit mode), the controller 33 selects the normal MMC mode (x1 bit mode) 41*a*.

Figure 36:
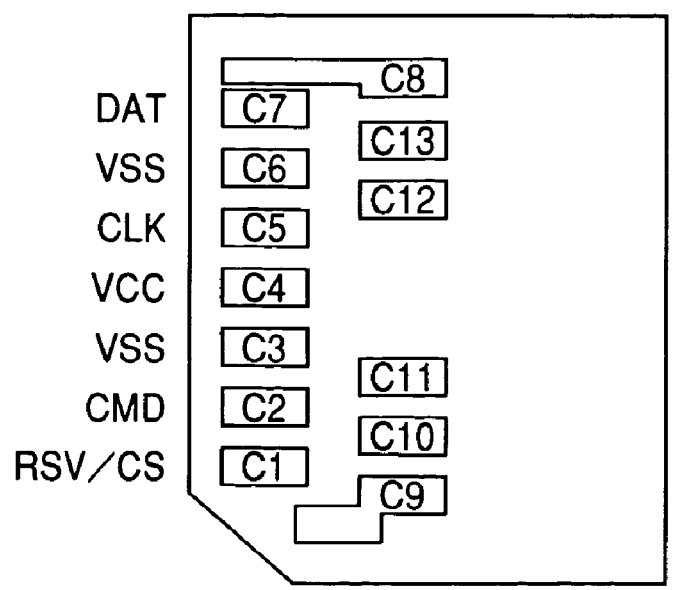
FIG. 36 is a plan view of the IC card of the first embodiment, showing the relation between the external terminals Cn and the signals when the MMC/SD-mode interface controller is selected and the 1-bit mode is selected.

The external terminals Cn and the signal terminals are related as shown in FIG. 36. Specifically, external terminals C1, C5, and C7 of RS-MMC are the RSV/CS, CLK, and DAT signal terminals, respectively. Terminal RSV/CS is for either a reserved signal (RSV) or CS signal. Terminal C2 is for the CMD signal, C3 and C6 are for the VSS and VCC voltages, respectively.

As described above, the IC card of this embodiment can be used as memories of various standards owing to the provision of the voltage pull-down detector 35, mode controller 33, USB-mode I/F controller 37, MS-mode I/F controller 39 and I/F controllers for other memory standards.

Owing to the incorporation of the controller IC 17 within the IC card, each card adapter does not need to have its own controller, enabling the cost-down of adapter.

Although it is otherwise possible to provide each adapter with mode switching functions (35,33,37,39, etc.) for the adaption to other standards, the adapter needs to have an IC chip for those functions, resulting in a cost increase.

Whereas, the provision of the voltage pull-down detector and mode controller within the IC card, as in the case of this embodiment, enables the card adapters to suffice to have easy formation of inexpensive parts such as wiring lines and resistors in rendering the IC card the compatibility with memories of other standards.

Although this embodiment deals with the IC card compatibility with three standards including the SD card, MS card and USB-oriented memory, the inventive IC card and card adapter can be made compatible with more than three standards based on the provision of I/F controllers for other standards.

Although in this embodiment voltage pull-down resistors are used in the USB-type adapter and MS-type adapter, resistors may be used in adapters of arbitrary types.

Although this embodiment uses a scheme of voltage pull-down, voltage pull-up may be used instead. In any case, a voltage change caused by resistors can be used as signal generation. An alternative detector may be used for detecting the conduction between adapter external terminals which are left unused for signals.

Second Embodiment

A second embodiment of this invention pertains to the RS-MMC card adapter attachment direction and the shape of internal terminals of the adapter.

Figure 37:
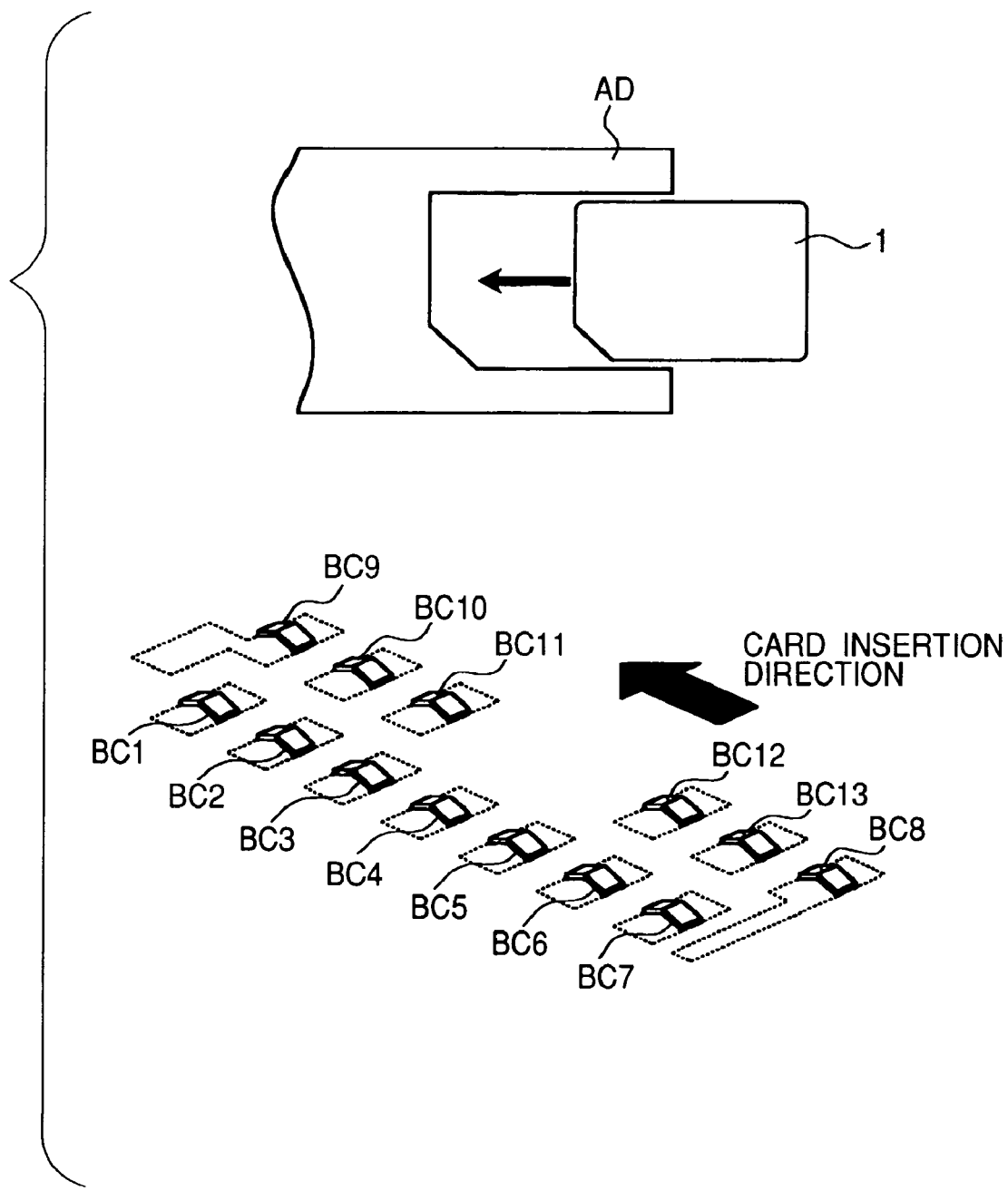
FIG. 37 is a plan view showing the insertion direction of the IC card (RS-MMC) based on a second embodiment of this invention, and a perspective view showing the shape of the internal terminals of the adapter.

(1) FIG. 37 shows perspectively the internal terminals of a card adapter AD of the case where the RS-MMC 1 is put into the adapter AD from the short side of adapter as explained on FIG. 8 in the first embodiment.

When the RS-MMC 1 is put in the adapter AD, the RS-MMC external terminals Cn come in contact with the internal terminals BCn formed on the interior wall of the adapter AD as shown in the figure. The internal terminals BCn are spring-active terminals having a generally rectangular profile in plan and having their long side extending in the card insertion direction (along the long side of card and adapter). The internal terminals BCn are formed to swell in the cross section taken along the long side of RS-MMC.

Due to this profile of adapter internal terminals BCn, the RS-MMC external terminals and adapter internal terminals are eased of mechanical stress at the putting in and out of the card and also ensured in their electrical contact. Shown by dotted patterns in the figure (also in FIG. 40 and FIG. 41) are areas of external terminals of RS-MMC.

Figure 38:
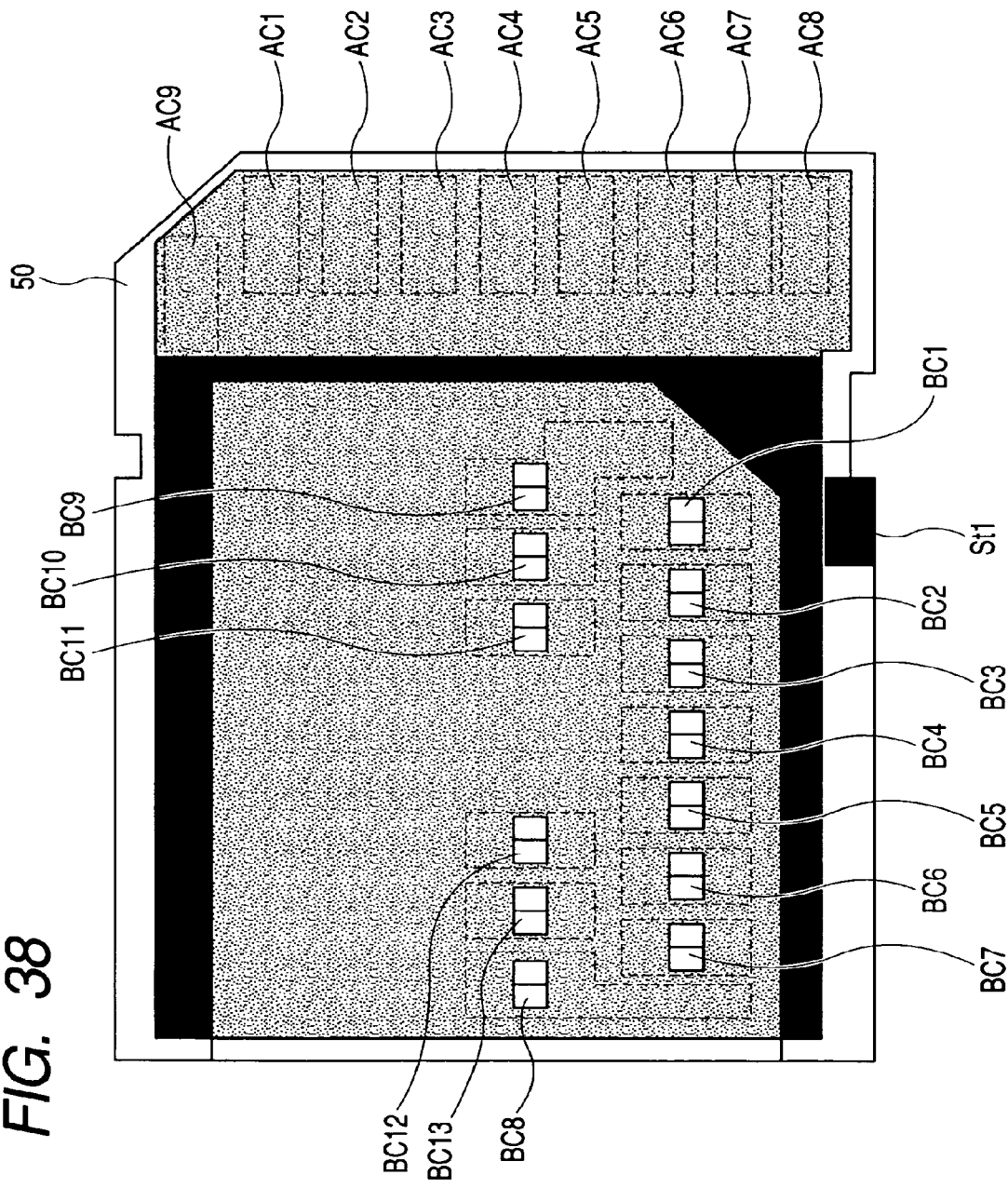
FIG. 38 is a principal plan view showing an SD-type adapter of the second embodiment, with an RS-MMC being set therein.
Figure 39:
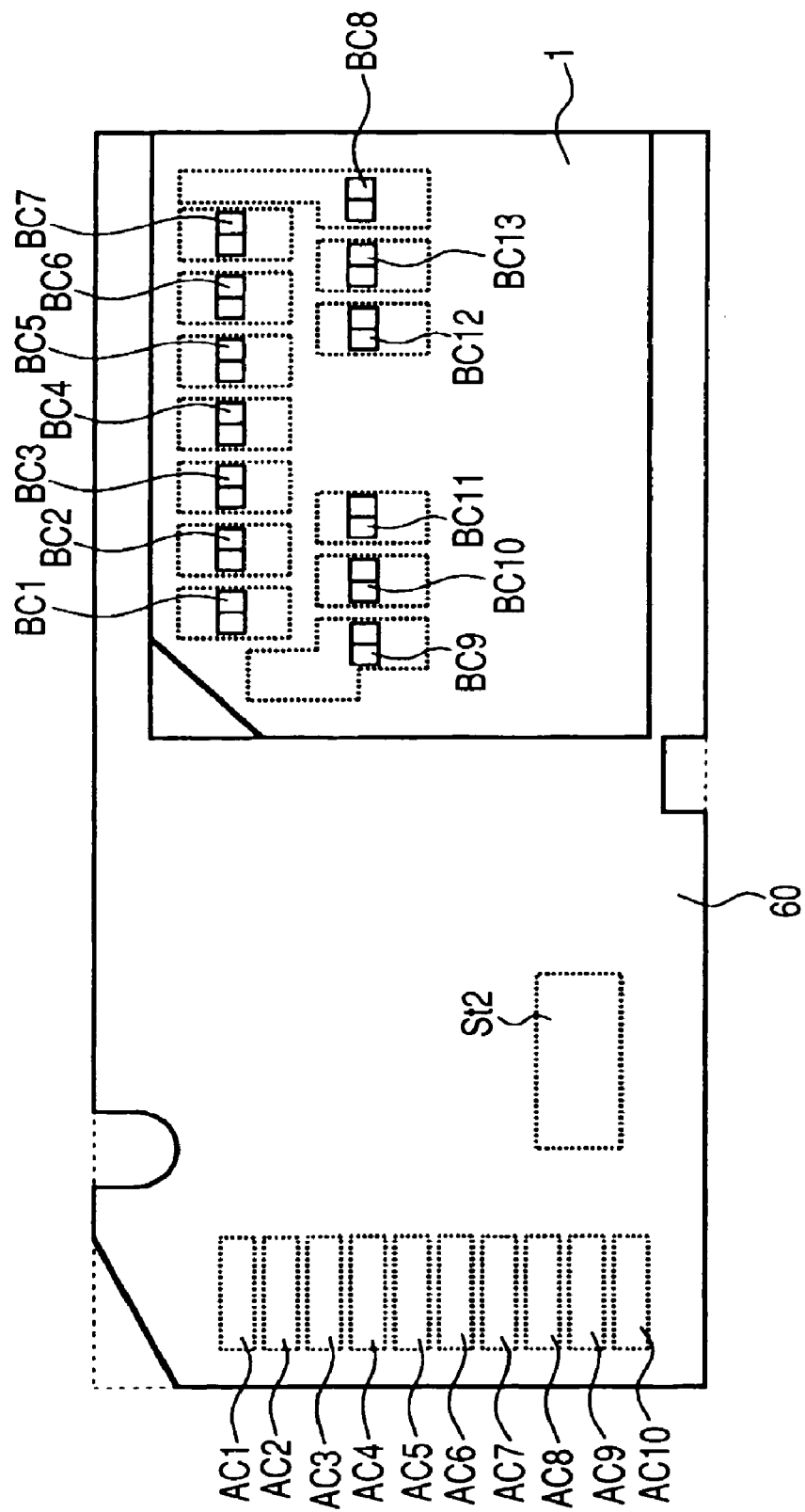
FIG. 39 is a principal plan view showing an MS-type adapter of the second embodiment, with an RS-MMC being set therein.

FIG. 38 and FIG. 39 show in plan the layout of the internal terminals BCn of this embodiment on the SD-type adapter, with the RS-MMC being set, shown in FIG. 13 and on the MS-type adapter, with the RS-MMC being set, shown in FIG. 20.

Figure 40:
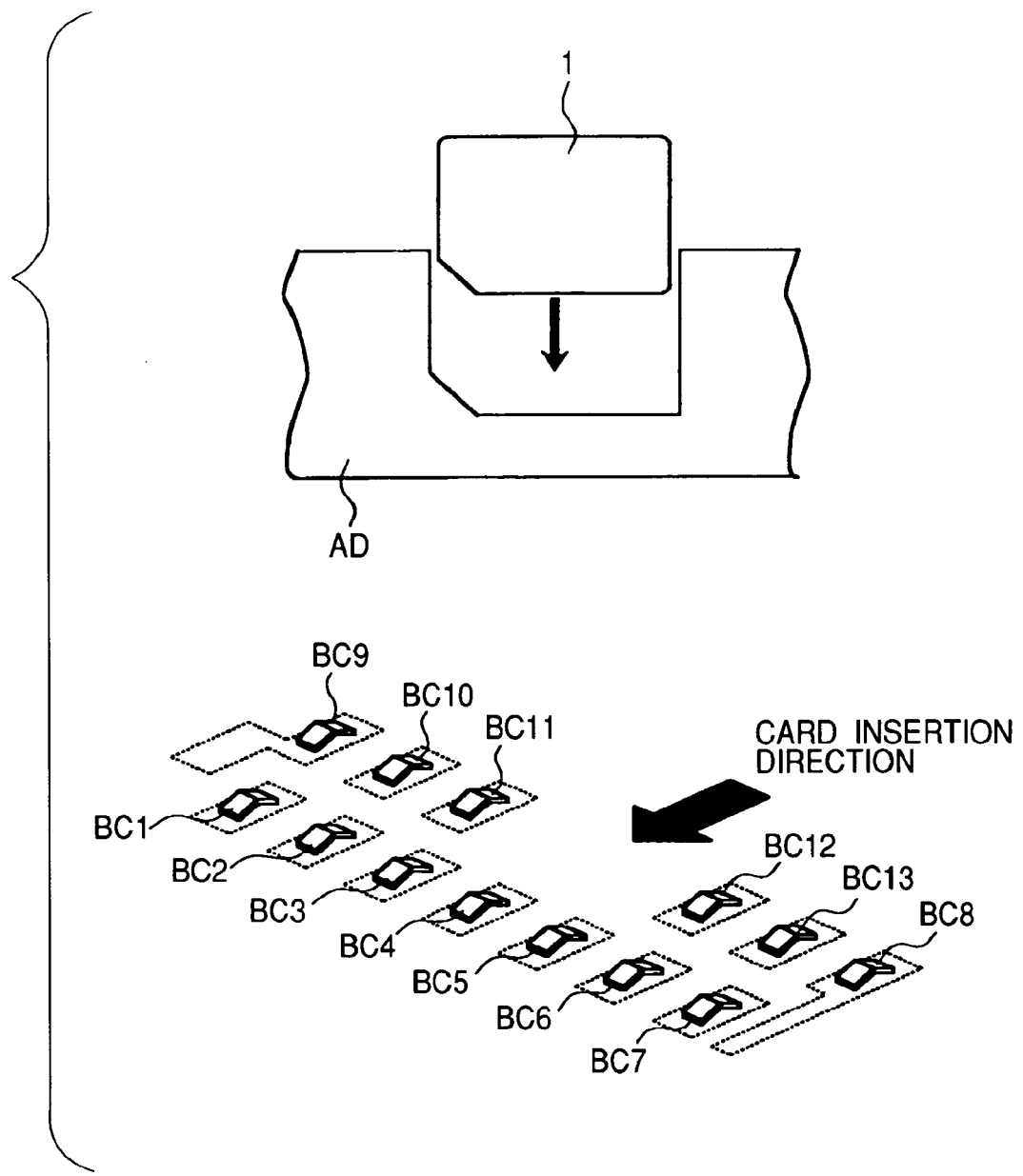
FIG. 40 is a plan view showing the insertion direction of the IC card (RS-MMC) of the second embodiment, and a perspective view showing the shape of the internal terminals of the adapter.

(2) FIG. 40 shows perspectively the internal terminals of a card adapter AD of the case where the RS-MMC 1 is put into the adapter from the long side of adapter as explained on FIG. 10 in the first embodiment.

The internal terminals BCn of adapter have a generally rectangular profile in plan and have their long side extending in the card insertion direction (along the short side of card and adapter) as shown in the figure. The internal terminals BCn are formed to swell in the cross section taken along the short side of RS-MMC.

Due to this profile of adapter internal terminals BCn, the RS-MMC external terminals and adapter internal terminals are eased of mechanical stress at the putting in and out of the card and also ensured in their electrical contact. In addition, this internal terminal layout allows a sufficient spacing among the terminals BCn.

Figure 41:
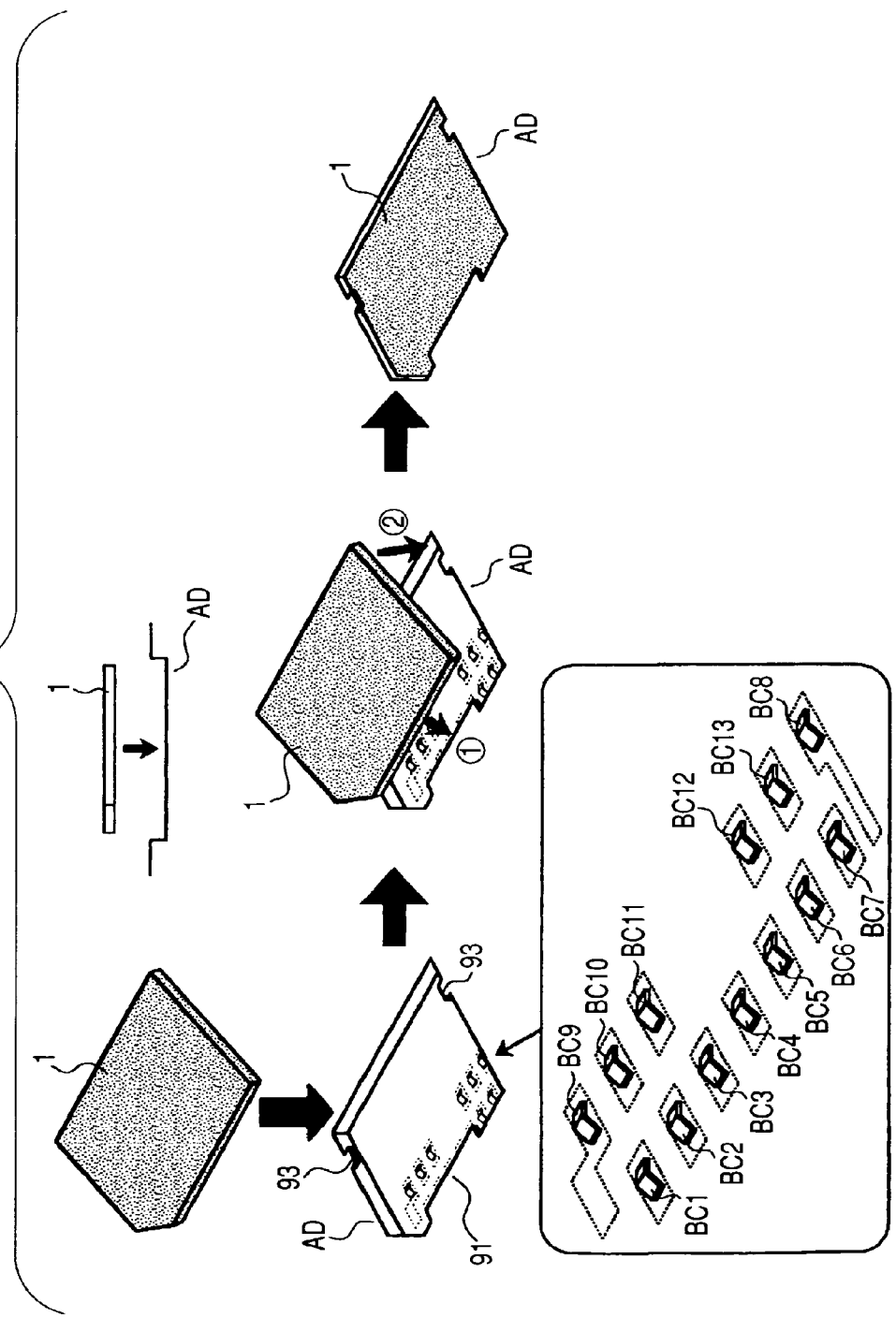
FIG. 41 is a set of plan views showing the insertion direction of the IC card (RS-MMC) of the second embodiment, and a perspective view showing the shape of the internal terminals of the adapter.

(3) FIG. 41 shows the adapter internal terminals and the manner of card setting of the case where the RS-MMC 1 is put into the adapter AD from the top of adapter as explained on FIG. 9 of the first embodiment.

The internal terminals BCn of adapter have a generally rectangular profile in plan and have their long side extending along the short side of RS-MMC as shown in the figure. The internal terminals are formed to swell in the cross section taken along the short side of RS-MMC.

In addition, the adapter AD has the formation of a latch 91 and lock nails 93, by which the RS-MMC 1 can be secured.

In regard to the adapter internal terminals BCn explained throughout the paragraphs (1)-(3), internal terminals may be laid out in correspondence to all 13 terminals of RS-MMC, or internal terminals which correspond to unused terminals of RS-MMC depending on the card mode may not be laid out.

The adapter AD of this embodiment can be any of the SD-type adapter, MS-type adapter, MSDuo-type adapter, and USB-type adapter.

The internal terminals BCn of this embodiment are preferably fixed at their one flat end next to the swelling section by soldering to the wiring board in the adapter, while being left free at their another end, so that the internal terminals exert a pushing force on the external terminals Cn (n=1-13) of RS-MMC.

Third Embodiment

A third embodiment of this invention pertains to kits for sale of the RS-MMC and its assortment of adapters which have been explained in the first embodiment.

Figure 42:
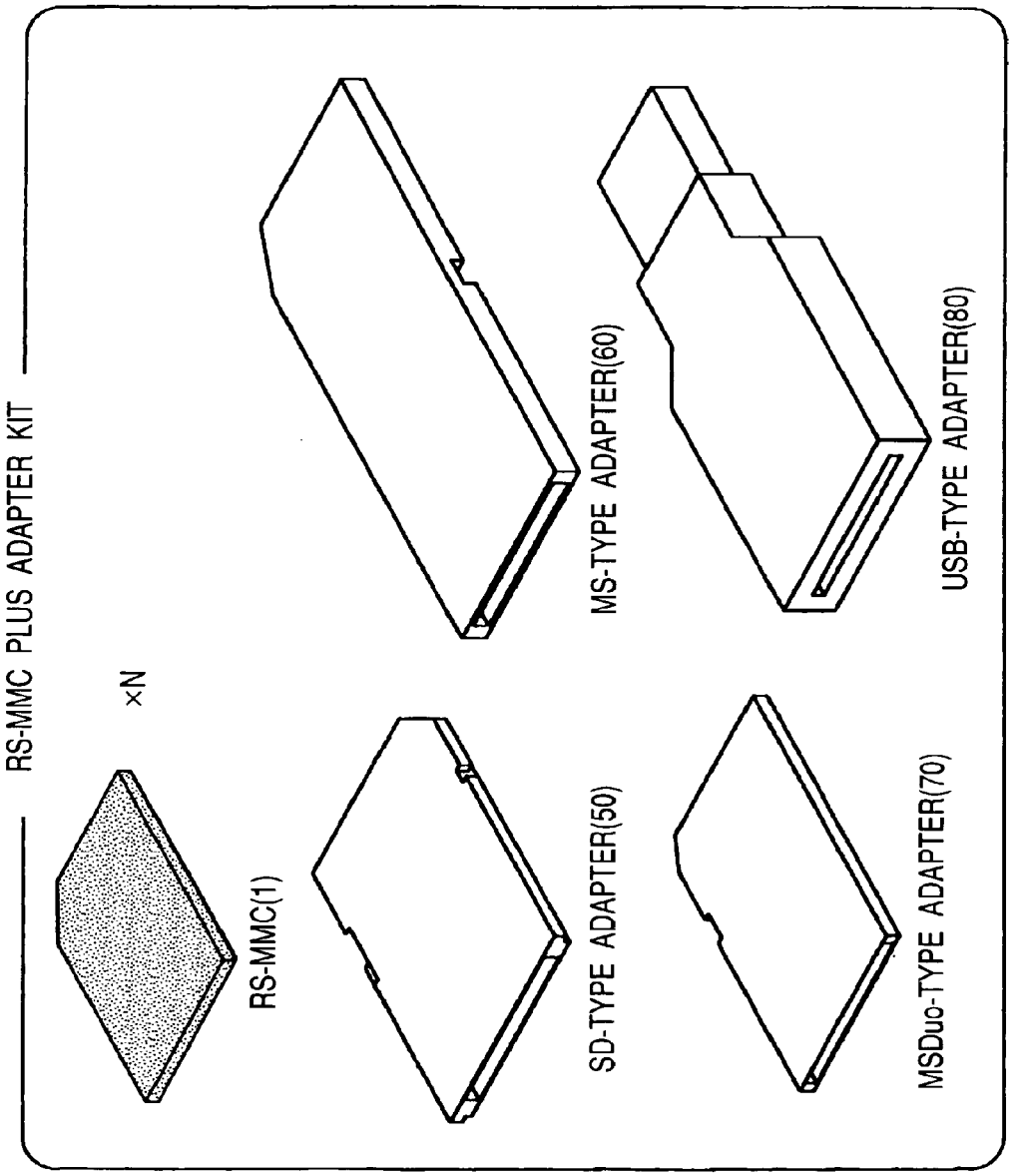
FIG. 42 is a perspective view of an IC card (RS-MMC) based on a third embodiment of this invention and an assortment of adapters of various types.

(1) FIG. 42 shows perspectively a kit of RS-MMC 1 and various card adapters. This adapter kit includes the RS-MMC 1, SD-type adapter 50, MS-type adapter 60, MSDuo-type adapter 70 and USB-type adapter 80. The adapter kit may include more than one (xN) RS-MMC, or may include the card extender 9 which has been explained on FIG. 6.

The sale kit of RS-MMC and adapters provides the RS-MMC users with the compatibility with various electronic appliances which deal with SD cards, MS cards and USB-oriented memories. It also facilitates the data transaction (writing and reading) among various electronic appliances.

Figure 43:
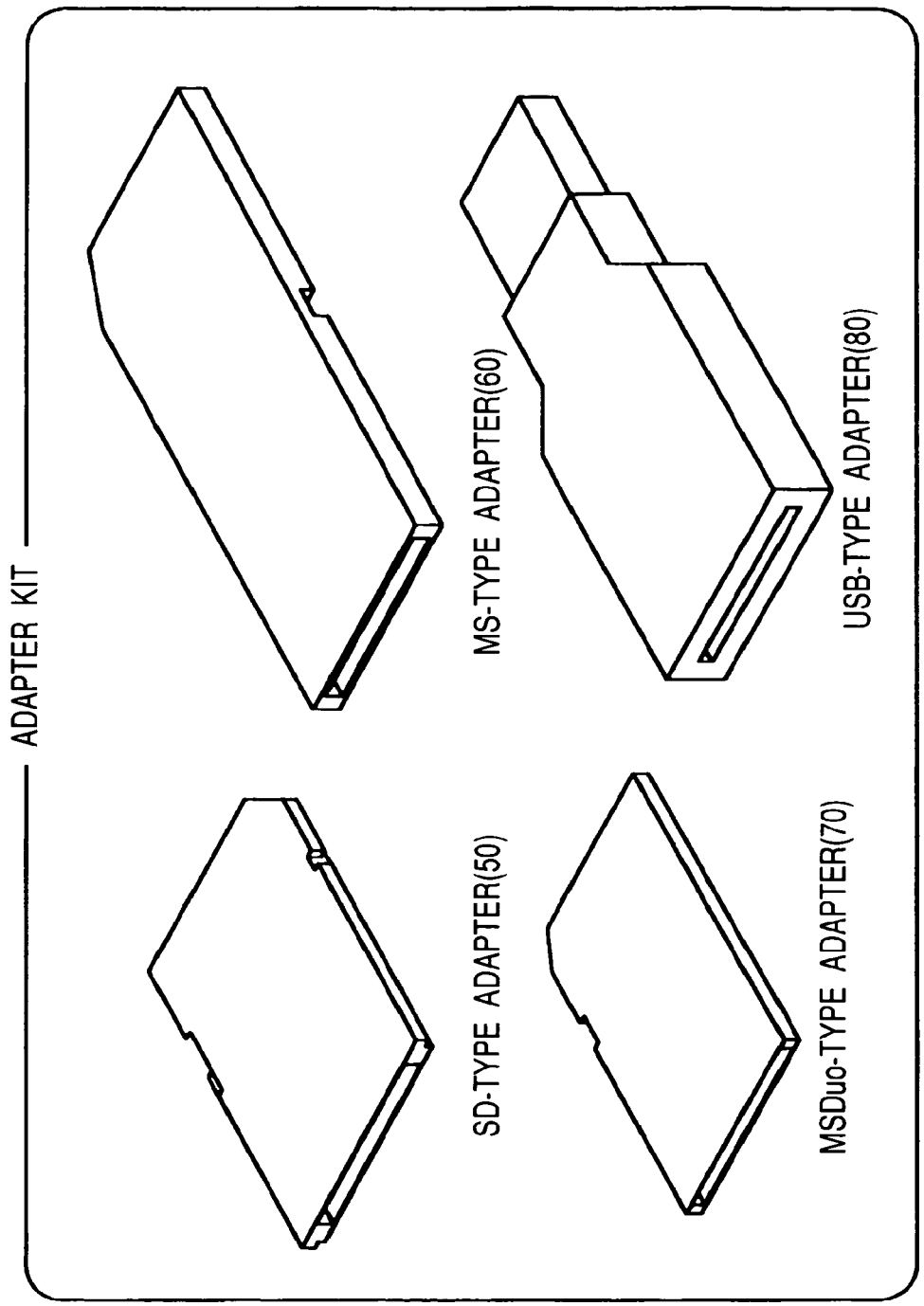
FIG. 43 is a set of perspective views of an assortment of adapters of various types of the third embodiment.

(2) FIG. 43 shows perspectively a kit various card adapters.

This adapter kit includes the SD-type adapter 50, MS-type adapter 60, MSDuo-type adapter 70 and USB-type adapter 80. The adapter kit may include the card extender 9 which has been explained on FIG. 6.

The sale kit of adapters provides the RS-MMC users with the compatibility with various electronic appliances. It also facilitates the data transaction (writing and reading) among various electronic appliances. It also fosters the prevalence of the RS-MMC 1.

Fourth Embodiment

Figure 44:
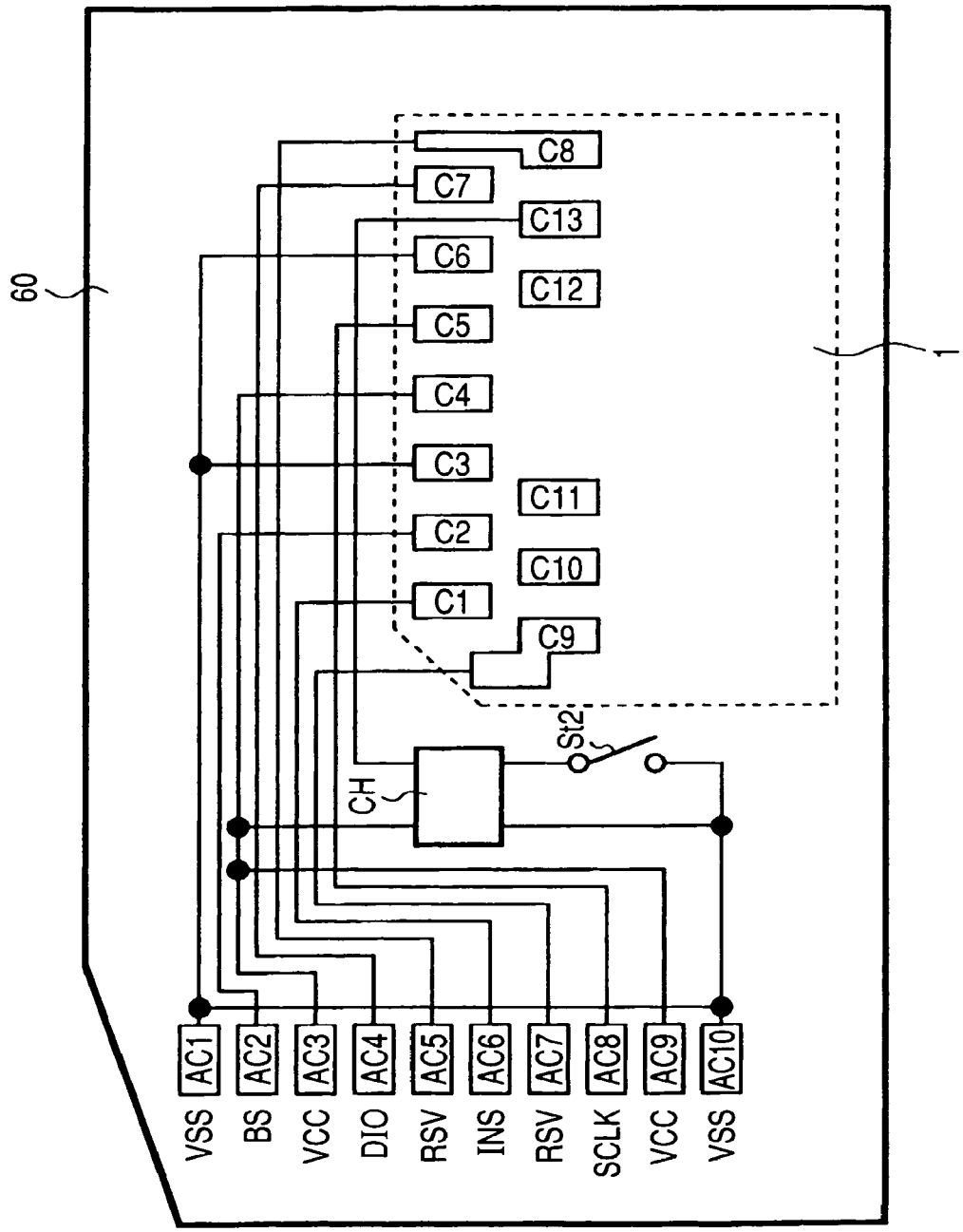
FIG. 44 is a plan view of an MS-type adapter based on a fourth embodiment of this invention, showing the spatial relation of the external terminals of adapter, the external terminals of RS-MMC, and the wiring lines of the adapter for connecting between these terminals.

In contrast to the first embodiment in which each card adapter has only wiring lines and resistors, it may be provided with an IC chip for mode determination as shown in FIG. 44.

FIG. 44 shows in plan the relation of the external terminals ACn (n=1-10) of the MS-type adapter 60, the external terminals Cn (n=1-13) of the RS-MMC 1, and the wiring lines of adapter for connecting between these terminals.

The external terminals ACn of the MS-type adapter 60 and the external terminals Cn of the RS-MMC 1 are the same as explained in paragraph (2) of the first embodiment and on FIG. 21, and explanation is not repeated. The connection between the external terminals ACn and Cn is mostly the same as explained on FIG. 21, and only different affairs will be explained.

An IC chip CH is connected between external terminals AC3 and AC10, for example, of the MS-type adapter. The IC chip CH further has the connection to terminal AC10 via a switch St2, and the connection to external terminal C13. The switch St2 is disposed on the rear side of the MS-type adapter 60, and it is operated mechanically to connect or disconnect electrically between the IC chip CH and terminal AC10.

Figure 45:
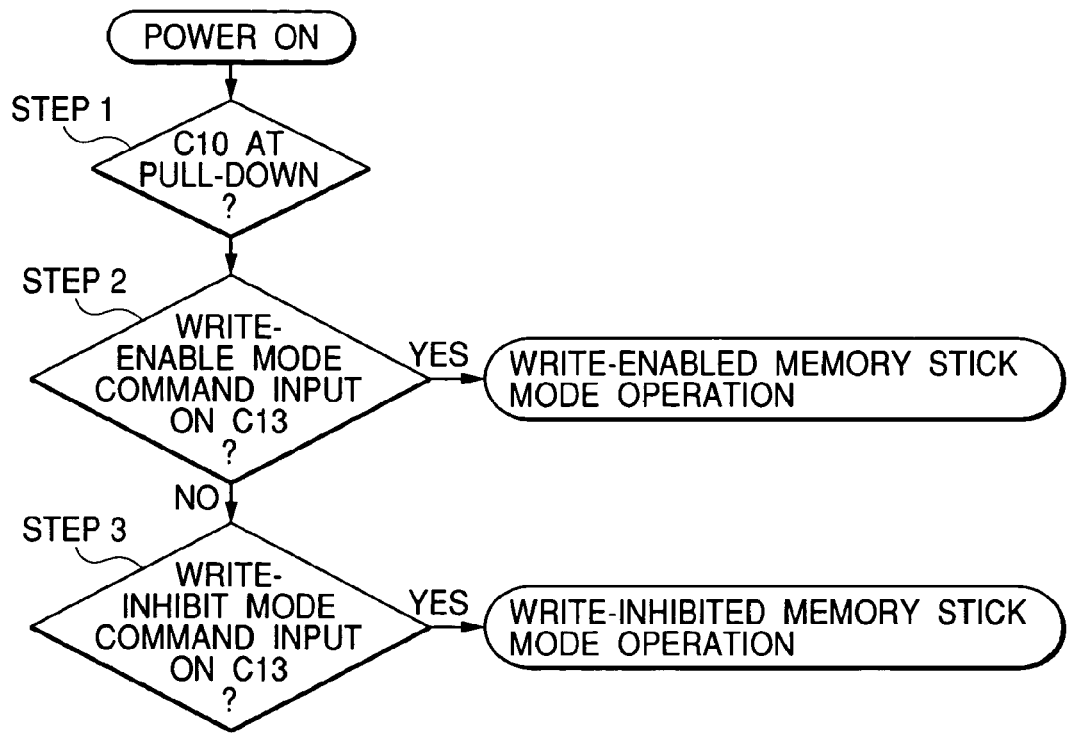
FIG. 45 is a flowchart showing the mode switching operation of the controller of the IC card of the fourth embodiment.

The switch St2 enables the selection between, for example, the write-enable mode and the write-inhibit mode in the MS mode in accordance with the operation shown by flowchart in FIG. 45.

This flowchart derives from the flowchart of FIG. 30 which has been explained for the first embodiment, and only distinct steps 2 and 3 will be explained here.

Step 2: When the switch St2 is off, the IC chip CH issues a write-enable command and gives to external terminal C13. In response to the entry of the write enable command, the mode controller 33 of RS-MMC 1 shown in FIG. 7 selects the MS mode (39) and write enable mode.

Step 3: When the switch St2 is on, the IC chip CH issues a write inhibit command and gives to external terminal C13. In response to the entry of the write-inhibit command, the mode controller 33 of RS-MMC 1 shown in FIG. 7 selects the MS mode (39) and write-inhibit mode.

If no command is placed on external terminal C13, the operational sequence proceeds to step 4 in FIG. 30.

In this manner, the RS-MMC 1 has its operational mode switched in response to the command from the IC chip CH on the adapter, instead of the provision of the voltage pull-down detector 35 shown in FIG. 7.

An additional cost of the IC chip CH is imposed on this adapter obviously in contrast to the adapters explained in the first embodiment.

An alternative scheme of mode switching is providing a mode command generation means on the part of host electronic appliances.

However, the IC card and adapter of this embodiment render the higher generality for themselves by being not reliant on host electronic appliances.

The IC chip CH can be less costly by having only a mode command generating function.

Specifically, the IC chip CH of adapter does not necessitate a large intricate circuit for the writing and reading of IC card, e.g., I/F controllers for individual modes, which is included in the controller of RS-MMC. An IC chip CH of a sole mode command generating circuit is simple in arrangement and low in cost, and therefore adapters which mount this IC chip CH can be inexpensive.

Functions which are simple in circuit arrangement and common among adapters of all types (functions needed by any adapter) are preferably included in the IC chip CH on the part of adapters with the intention of cost reduction of IC chip CH.

Although this embodiment uses the IC chip CH on the MS-type adapter, it can be mounted on any type of adapter.

Although the present invention has been described in connection with the specific embodiments, the invention is not confined to these embodiments, but various alterations are obviously possible without departing from the essence of the invention.

Among the affairs of the present invention disclosed in this specification, the major effectiveness is briefed as follows.

An IC card of a first standard includes therein a detector for detecting the voltage level of a certain external terminal among multiple external terminals and a mode controller connected to the detector. The mode controller selects a first mode interface controller of the first standard or a second mode interface controller of a second standard in accordance with the output signal of the detector, whereby the IC card can be compatible with IC cards of the second standard.

An IC card of the first standard, which is set in the adapter having a profile of an IC card of the second standard, can become compatible with IC cards of the second standard. The adapter suffices to have wiring lines and resistors which are easy in formation and low in cost, and renders the IC card the compatibility with IC cards of other standard.

The invention claimed is:

1. An IC card in compliance with a first standard, comprising:
    (a) a plurality of external terminals;
    (b) a detection unit that detects a level of potential at a predetermined external terminal of the plurality of external terminals;
    (c) a mode controller connected with the detection unit; and
    (d) a first mode interface controller configured to provide interface functions corresponding to the first standard and a second mode interface controller configured to provide interface functions different from said first mode interface controller and corresponding to a second standard, which first and second mode interface controllers are each separately connected with the mode controller,
    (e) wherein the mode controller comprises a means for selecting the first mode interface controller or the second mode interface controller based on a signal of the detection unit.

2. An IC card in compliance with a first standard, comprising:
    (a) a plurality of external terminals;
    (b) a detection unit that detects a level of potential at a predetermined external terminal of the plurality of external terminals;
    (c) a mode controller connected with the detection unit; and
    (d) a first mode interface controller corresponding to the first standard, a second mode interface controller corresponding to a second standard for IC cards in compliance with the second standard, and a third mode interface controller corresponding to a third standard as a terminal standard, which interface controllers are connected with the mode controller,
    wherein the mode controller comprises a means for selecting any one of the first mode interface controller, second mode interface controller, and third mode interface controller based, on a signal of the detection unit,
    wherein said first mode interface controller is configured to provide interface functions different from said second and third mode interface controllers, said second mode interface controller is configured to provide interface functions different from said first and third mode interface controllers, and said third mode interface controller is configured to provide interface functions different from said first and second mode interface controllers, and
    wherein the first, second, or third mode interface controllers are each separately connected with the mode controller.

3. The IC card according to claim 2,
    wherein the detection unit comprises a means for detecting pull-down potential or pull-up potential.

4. The IC card according to claim 2,
    wherein the first standard is a multimedia card standard, the second standard is a memory stick standard, and the third standard is a USB standard.

5. The IC card according to claim 2,
    wherein the first mode interface controller has two or more bit modes and changes the bit mode according to a response that occurs when a command signal is transmitted to any of the external terminals.

6. The IC card according to the claim 5,
    wherein one of the two or more bit modes corresponds to an SD card standard.

7. An IC card provided in compliance with a first standard, the IC card comprising:
    a plurality of first external terminals; and
    an adapter having a profile of an IC card provided in compliance with a second standard and having a plurality of second external terminals connected with the plurality of first external terminals in an inserted state of the IC card provided in compliance with the first standard,
    wherein the IC card provided in compliance with the first standard includes
        an electrically writeable and erasable flash memory chip; and
    a controller chip that controls the flash memory chip,
    the plurality of first external terminals including a plurality of detection terminals constructed to detect a changed potential level in a condition in which the adapter is connected with an external appliance, and wherein the controller chip comprises
    a first mode interface controller corresponding to the first standard;
    a second mode interface controller corresponding to the second standard;
    a detection unit coupled to the plurality of detection terminals and configured to detect a level of a potential at a predetermined one of the plurality of first external terminals;
    a mode controller that switches control from the first mode interface controller to the second mode interface controller according to a detection result provided by the detection unit;
    a flash memory controller that controls the flash memory chip;
    a first wire coupled to the first mode interface controller and to the flash memory controller; and
    a second wire coupled to the second mode interface controller and to the flash memory controller.

8. The IC card according to the claim 7,
wherein the IC card provided in compliance with the first standard has first and second end areas,
wherein the first external terminals are disposed nearer to the second end area than to the first end area,
wherein the flash memory chip is disposed nearer to the first end area than to the second end area, and
wherein the controller chip is arranged to be between the first external terminals and the flash memory chip.

9. The IC card according to the claim 8,
wherein the flash memory controller is arranged to be disposed nearer to the flash memory chip than to the plurality of first external terminals, and
wherein the first mode interface controller and the second mode interface controller are each arranged to be between the plurality of first external terminals and the flash memory controller.

10. The IC card according to the claim 9,
wherein two or more chips are overlapped with the flash memory chip in plan view.

11. The IC card according to the claim 9,
wherein the IC card provided in compliance with the first standard includes a substrate having a front surface and a back surface opposed to the front surface,
wherein a plurality of wires are disposed on the front surface of the substrate,
wherein the first external terminal electrically coupled to each of the wires on the front surface of the substrate is disposed on the back surface of the substrate,
wherein the controller chip and the flash memory chip are each disposed on the front surface of the substrate, and
wherein the plurality of wires disposed on the front surface of the substrate, the controller chip, and the flash memory chip are electrically connected to each other using gold wiring lines.

12. The IC card according to the claim 11,
wherein the plurality of wires disposed on the front surface of the substrate, the controller chip, the flash memory chip, and the gold wiring lines are coated with a sealing resin.

* * * * *